(12) United States Patent
Kozono et al.

(10) Patent No.: US 12,376,230 B2
(45) Date of Patent: Jul. 29, 2025

(54) STRUCTURE WITH CONDUCTIVE PATTERN AND METHOD FOR MANUFACTURING SAME

(71) Applicant: Asahi Kasei Kabushiki Kaisha, Tokyo (JP)

(72) Inventors: Tomoko Kozono, Tokyo (JP); Toru Yumoto, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 288 days.

(21) Appl. No.: 17/770,303

(22) PCT Filed: Nov. 5, 2020

(86) PCT No.: PCT/JP2020/041415
§ 371 (c)(1),
(2) Date: Apr. 20, 2022

(87) PCT Pub. No.: WO2021/090893
PCT Pub. Date: May 4, 2021

(65) Prior Publication Data
US 2022/0408558 A1 Dec. 22, 2022

(30) Foreign Application Priority Data
Nov. 8, 2019 (JP) .................. 2019-203276

(51) Int. Cl.
*H05K 1/09* (2006.01)
*C09D 11/037* (2014.01)
(Continued)

(52) U.S. Cl.
CPC ............. *H05K 1/09* (2013.01); *C23C 18/165* (2013.01); *C23C 18/1875* (2013.01);
(Continued)

(58) Field of Classification Search
CPC ........ H05K 1/09; H05K 1/0237; H05K 1/092; H05K 3/10
See application file for complete search history.

(56) References Cited

U.S. PATENT DOCUMENTS 9,929,111 B2 * 3/2018 Mischitz ........... H01L 23/53238
2012/0031656 A1 2/2012 Oka et al.
(Continued)

FOREIGN PATENT DOCUMENTS

| JP | 2007-063661 A | 3/2007 |
|---|---|---|
| JP | 2014-011199 A | 1/2014 |

(Continued)

OTHER PUBLICATIONS

Supplementary European Search Report issued in European Patent Application No. 20885235.0 dated Dec. 1, 2022.
(Continued)

*Primary Examiner* — Hoa C Nguyen
*Assistant Examiner* — Amol H Patel
(74) *Attorney, Agent, or Firm* — Morgan, Lewis & Bockius LLP

(57) ABSTRACT

Provided are: a structure with a conductive pattern that can be obtained in a simple manufacturing process and that exhibits favorable interlayer adhesion; and a method for manufacturing same. An embodiment of the present invention provides a structure with a conductive pattern, the structure comprising a base material, and a copper-containing conductive layer arranged on the surface of the base material, wherein when a principal surface of the conductive layer on the side facing the base material is a first principal surface, and a principal surface of the conductive layer on the opposite side from the first principal surface is a second principal surface, the conductive layer: has a porosity of 0.01 to 50 volume percent in a first principal surface-side
(Continued)

region that extends from the first principal surface to a depth of 100 nm in the thickness direction of the conductive layer.

15 Claims, 3 Drawing Sheets

(51) Int. Cl.
    *C09D 11/52* (2014.01)
    *C23C 18/16* (2006.01)
    *C23C 18/18* (2006.01)
    *C23C 18/40* (2006.01)
    *H01Q 1/38* (2006.01)
    *H05K 1/02* (2006.01)
    *H05K 3/10* (2006.01)

(52) U.S. Cl.
    CPC ............. *C23C 18/40* (2013.01); *H01Q 1/38* (2013.01); *H05K 1/0237* (2013.01); *H05K 3/10* (2013.01)

(56) References Cited

U.S. PATENT DOCUMENTS

| | | |
|---|---|---|
| 2014/0308460 A1 | 10/2014 | Uchida |
| 2015/0021071 A1 | 1/2015 | Kawato et al. |
| 2016/0024316 A1 | 1/2016 | Sasada et al. |
| 2016/0137855 A1 | 5/2016 | Tsuyama et al. |
| 2017/0252801 A1 | 9/2017 | Ida et al. |
| 2017/0336710 A1 | 11/2017 | Baron et al. |
| 2018/0014403 A1* | 1/2018 | Kasuga ................ H05K 3/245 |
| 2019/0035719 A1* | 1/2019 | Daitoku ................ G06F 3/044 |
| 2021/0155818 A1 | 5/2021 | Tsuruta et al. |

FOREIGN PATENT DOCUMENTS

| | | |
|---|---|---|
| JP | 2014-148633 A | 8/2014 |
| JP | 2015-026567 A | 2/2015 |
| JP | 2015-027649 A | 2/2015 |
| JP | 2016-007797 A | 1/2016 |
| JP | 2016-033941 A | 3/2016 |
| JP | 2017-139294 A | 8/2017 |
| JP | 2019-090110 A | 6/2019 |
| JP | 2019-160689 A | 9/2019 |
| KR | 10-2015-0027649 A | 3/2015 |
| TW | 201101947 A1 | 1/2011 |
| TW | 201627770 A1 | 8/2016 |
| TW | 201910448 A | 3/2019 |
| WO | 2014/097817 A1 | 6/2014 |
| WO | 2016/031860 A1 | 3/2016 |
| WO | 2016/117575 A1 | 7/2016 |

OTHER PUBLICATIONS

Office Action issued in corresponding European Patent Application No. 20885235.0 dated Dec. 13, 2022.
International Search Report issued in corresponding International Patent Application No. PCT/JP2020/041415 dated Jan. 26, 2021.
International Preliminary Report on Patentability and Written Opinion issued in corresponding International Patent Application No. PCT/JP2020/041415 dated May 19, 2022.

* cited by examiner

STRUCTURE WITH CONDUCTIVE PATTERN AND METHOD FOR MANUFACTURING SAME

FIELD

The present invention relates to a structure with an electroconductive pattern and to a method for producing it.

BACKGROUND

Circuit boards have a structure with conductive wiring formed on a substrate. Methods for producing circuit boards are generally carried out in the following manner. First a photoresist is coated onto a substrate that has an attached metal foil. The photoresist is then exposed and developed to obtain a desired negative circuit pattern. The portions of the metal foil not covered by the photoresist are then removed by chemical etching to form a pattern. A high-performance circuit board can thus be produced. However, this conventional method is disadvantageous in that it has many steps making it more complex, while also requiring a photoresist material.

Printing technologies have therefore been developed for direct printing of wiring patterns onto substrates using dispersions comprising microparticles selected from among metal microparticles and metal oxide microparticles (hereunder also referred to as "paste materials"). Such technologies have very high productivity because they have few steps and do not require the use of photoresist materials.

In direct printing techniques, the paste material is applied onto a substrate (as a support) and then fired to form a metallic film (a copper-containing film, for example, when copper microparticles and/or copper oxide particles are used) on the substrate. It is known that adhesiveness between the support and metallic film can be provided by using colloidal silica composed of silicon oxide as a ground layer on the substrate (see PTL 1, for example).

CITATION LIST

Patent Literature

[PTL 1] International Patent Publication No. WO2016/031860

SUMMARY

Technical Problem

Colloidal silica used as a ground layer as described in PTL 1, while having excellent adhesiveness with metals, has poor adhesiveness with resins. When the substrate is a resin, therefore, the ground layer and substrate often become detached upon infiltration of chemicals or thermal expansion, resulting in lower product reliability. The number of processing steps is also increased since a step of coating the colloidal silica onto the substrate is necessary.

In light of this situation, it is an object of the present invention to provide a structure with an electroconductive pattern that can be obtained by convenient production steps and exhibits satisfactory interlayer adhesiveness, as well as a process for producing it.

Solution to Problem

Specifically, the present disclosure encompasses the following aspects.

[1] A structure with an electroconductive pattern comprising a substrate, and a copper-containing electroconductive layer disposed on the surface of the substrate,
wherein, when the main surface of the electroconductive layer on the opposite side from the substrate is defined as the first main surface and the main surface on the opposite side from the first main surface is defined as the second main surface, the electroconductive layer has a porosity of 0.01 vol % to 50 vol % in the first main surface-side region that extends from the first main surface to a depth of 100 nm in the thickness direction of the electroconductive layer, and has a porosity of 10 vol % or lower in the second main surface-side region that extends from the second main surface to a depth of 100 nm in the thickness direction of the electroconductive layer.

[2] The structure with an electroconductive pattern according to aspect 1, wherein the porosity in the first main surface-side region is greater than the porosity in the second main surface-side region.

[3] The structure with an electroconductive pattern according to aspect 1 or 2, wherein the element ratio of oxygen atoms to copper atoms in the first main surface-side region is greater than the element ratio of oxygen atoms to copper atoms in the second main surface-side region.

[4] The structure with an electroconductive pattern according to any one of aspects 1 to 3, wherein the element ratio of oxygen atoms to copper atoms in the first main surface-side region is greater than 0.025.

[5] The structure with an electroconductive pattern according to any one of aspects 1 to 4, wherein the second main surface includes nickel and/or gold.

[6] The structure with an electroconductive pattern according to any one of aspects 1 to 5, wherein part of the electroconductive layer is covered with a resin.

[7] The structure with an electroconductive pattern according to any one of aspects 1 to 6, which further comprises a solder layer situated on part of the surface of the electroconductive layer.

[8] The structure with an electroconductive pattern according to any one of aspects 1 to 7, wherein the electroconductive layer is an antenna.

[9] The structure with an electroconductive pattern according to any one of aspects 1 to 8, wherein the electroconductive layer is printed circuit board wiring.

[10] A method for producing a structure with an electroconductive pattern, which includes:
a coated film-forming step in which a dispersion containing copper oxide particles is coated onto a substrate to obtain a coated film,
a drying step in which the coated film is dried,
an exposure step in which the coated film after the drying step is exposed to laser light to obtain a copper-containing film, and
a plating step in which the copper-containing film is plated to obtain an electroconductive layer including the copper-containing film and a plating layer.

[11] The method for producing a structure with an electroconductive pattern according to aspect 10, which further includes a developing step in which the laser light-unexposed sections of the coated film are removed, between the exposure step and the plating step.

[12] The method for producing a structure with an electroconductive pattern according to aspect 10 or 11, wherein the plating is carried out by applying a plating solution with a copper concentration of 1.5 g/L to 5.0 g/L to the copper-containing film.

Advantageous Effects of Invention

According to the invention it is possible to provide a structure with an electroconductive pattern that can be obtained by convenient production steps and exhibits satisfactory interlayer adhesiveness, as well as a process for producing it.

DESCRIPTION OF EMBODIMENTS

An embodiment of the invention (hereunder also referred to as "the embodiment") will now be explained for illustration purposes, with the understanding that the invention is not limited to the embodiment.

The present inventors have conducted much research on a structure with an electroconductive pattern having satisfactory interlayer adhesiveness that can be obtained by convenient production steps, and a method for producing the same. It has been found as a result that such properties can be obtained if a predetermined amount of voids are present in a fixed region in the electroconductive layer. The structure with an electroconductive pattern of the embodiment has excellent chemical resistance and can exhibit resistance to detachment by thermal expansion.

<Structure with Electroconductive Pattern>

Figure 1:
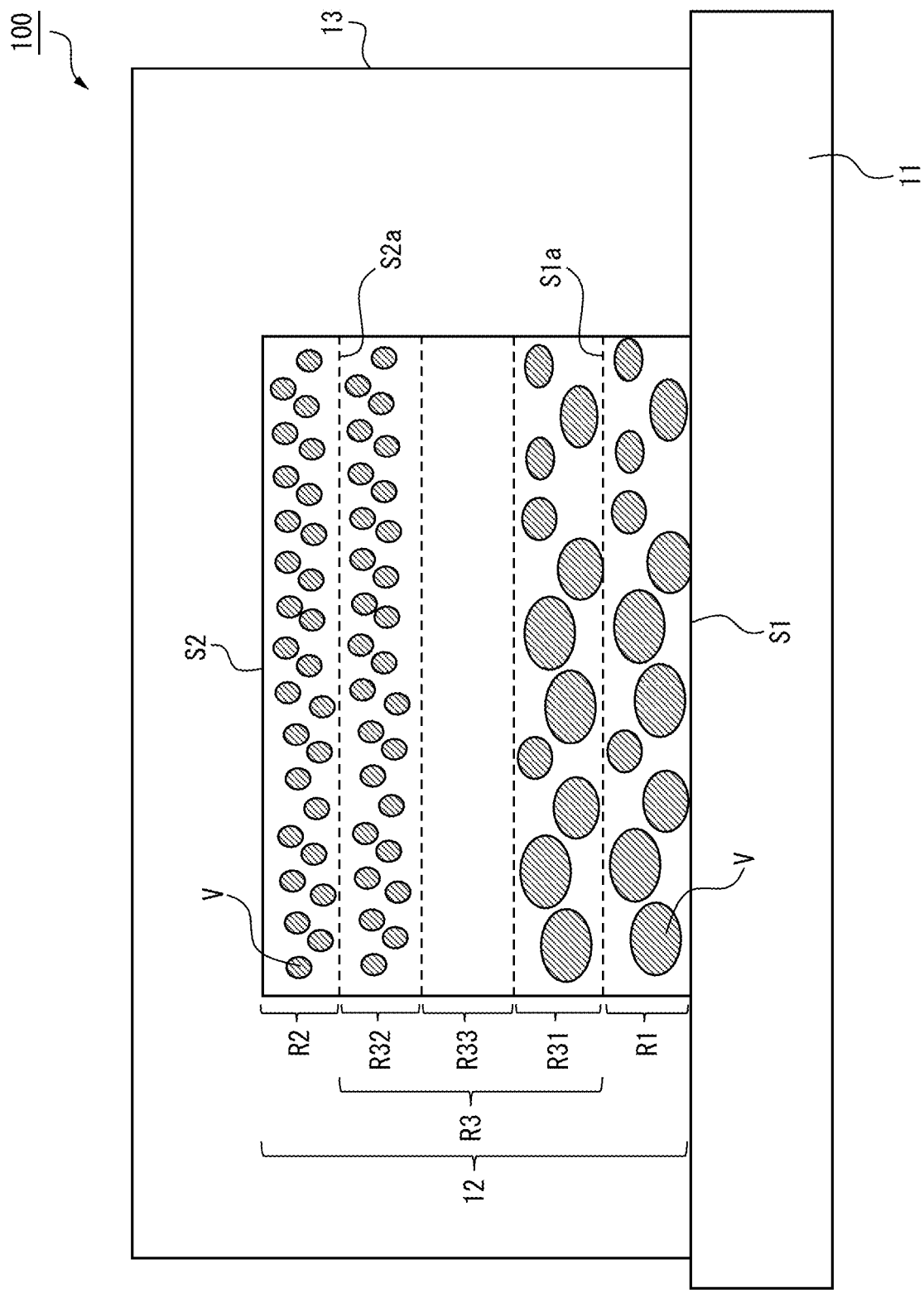
FIG. 1 is a cross-sectional schematic drawing showing a structure with an electroconductive pattern according to one aspect of the invention.

One aspect of the invention provides a structure with an electroconductive pattern comprising a substrate and a copper-containing electroconductive layer disposed on the surface of the substrate. Referring to FIG. 1, the structure with an electroconductive pattern 100 according to one aspect of the invention comprises a substrate 11 and a copper-containing electroconductive layer 12 disposed on the surface of the substrate 11. According to one aspect, if the main surface of the electroconductive layer 12 on the opposite side from the substrate 11 is defined as the first main surface S1 and the main surface on the opposite side from the first main surface S1 is defined as the second main surface S2, the electroconductive layer 12 has a porosity of 0.01 vol % to 50 vol % in a region R1 on the first main surface that extends from the first main surface S1 to a depth of 100 nm in the thickness direction of the electroconductive layer, and has a porosity of 10 vol % or lower in a region R2 on the second main surface that extends from the second main surface S2 to a depth of 100 nm in the thickness direction of the electroconductive layer.

A porosity of 0.01 vol % or greater in the first main surface-side region can relax stress caused by expansion of copper, providing resistance against heat shock. A porosity of 50 vol % or lower in the first main surface-side region is preferred for satisfactory interlayer adhesiveness (more specifically, adhesiveness between the substrate and electroconductive layer), thus reducing the likelihood of detachment by chemical agents, and for reduced surface area to result in satisfactory oxidation resistance.

The porosity of the first main surface-side region is preferably 0.05 vol % or greater, more preferably 0.1 vol % or greater, even more preferably 0.15 vol % or greater, yet more preferably 0.2 vol % or greater, even yet more preferably 0.25 vol % or greater, even yet more preferably 0.3 vol % or greater, even yet more preferably 0.35 vol % or greater, even yet more preferably 0.4 vol % or greater, and most preferably 0.5 vol % or greater. It is also preferably 45 vol % or lower, more preferably 40 vol % or lower, even more preferably 35 vol % or lower, yet more preferably 30 vol % or lower, even yet more preferably 25 vol % or lower, even yet more preferably 20 vol % or lower, even yet more preferably 15 vol % or lower, even yet more preferably 10 vol % or lower, even yet more preferably 7 vol % or lower, even yet more preferably 5 vol % or lower, and most preferably 3 vol % or lower.

If the second main surface-side region has a porosity of 10 vol % or lower the interlayer adhesiveness (more specifically the adhesiveness between the substrate and electroconductive layer) will be satisfactory, reducing the likelihood of detachment by chemical agents. The oxidation stability of the electroconductive layer will also be superior.

A porosity of 0.0001 vol % or greater in the second main surface-side region is preferred because it can relax stress caused by expansion of copper, to provide resistance against heat shock. The porosity is more preferably 0.0002 vol % or greater, more preferably 0.0003 vol % or greater, even more preferably 0.001 vol % or greater, even more preferably 0.01 vol % or greater and yet more preferably 0.05 vol % or greater. From the viewpoint of interlayer adhesiveness, the porosity is preferably 9 vol % or lower, more preferably 8 vol % or lower, even more preferably 5 vol % or lower, yet more preferably 3 vol % or lower, even yet more preferably 1 vol % or lower, even yet more preferably 0.5 vol % or lower and most preferably 0.1 vol % or lower.

The porosity in the first main surface-side region can be controlled by adjusting the output and/or speed and/or wavelength of the irradiated laser light used to form the electroconductive layer. For example, a higher laser output and a slower irradiation speed can reduce the porosity of the first main surface-side region, while a weaker laser output and a faster irradiation speed can increase the porosity of the first main surface-side region. The porosity of the second main surface-side region can be controlled by adjusting the degreasing step before plating and/or the plating temperature and/or the plating time and/or the plating solution composition and/or the plating solution copper concentration, for example. Carrying out a degreasing step before plating, for example, reduces the porosity in the second main surface-side region. Adjusting these parameters allows the porosity in the two regions, the first main surface-side region and second main surface-side region, to be limited to specified ranges.

According to one aspect, the porosity in the first main surface-side region is greater than the porosity in the second main surface-side region. In this case the difference between the porositys in the first main surface-side region and the second main surface-side region (units: vol %) is preferably 0.05 vol % or greater, 0.1 vol % or greater or 0.2 vol % or greater from the viewpoint of excellent chemical resistance. From the viewpoint of obtaining satisfactory interlayer adhesiveness, the difference may be 10 vol % or less, 5 vol % or less or 1 vol % or less, for example.

The porosity according to the present disclosure is an indicator of the number of voids present in the electroconductive layer. Voids are the sections lacking the structural material of the electroconductive layer (more specifically the conductive metal), and are typically independent voids surrounded by a continuous phase of the structural material (such as the voids V shown in FIG. 1). For the porosity according to the present disclosure, the electroconductive layer is consolidated on an epoxy resin, FIB (focused ion beam) processing is carried out to allow cross-section analysis with an SEM (scanning electron microscope), and the image obtained by SEM observation is binarized with ImageJ (Median→Threshold; Isodata), obtaining a value for the area % of the black portions, considering the area % to be the porosity (vol %). The long diameter, for the purpose of this disclosure, is the maximum distance between two arbitrary points along the peripheral edge of a single independent black portion in the processed image. The porosity for the copper-containing film is also the value obtained from a cross-sectional image obtained with a scanning electron microscope (SEM) by the same procedure.

Referring to FIG. 1, the first main surface-side region R1 is a region from the first main surface S1 of the electroconductive layer 12 (the surface on the side facing the substrate 11) up to the side S1a which is the side moved 100 nm inward on the electroconductive layer in the thickness direction of the electroconductive layer so as to be parallel to the first main surface S1. The region R2 on the second main surface is a region from the second main surface S2 of the electroconductive layer 12 (the surface on the opposite side from the substrate 11) up to the side S2a which is the side moved 100 nm inward on the electroconductive layer in the thickness direction of the electroconductive layer so as to be parallel to the second main surface S2. The shapes of the respective surfaces of the members composing the structure with an electroconductive pattern of the disclosure (which may be exposed surfaces or boundaries with other members) are not restricted and may be flat or curved, or with level differences, for example. In any case, the first main surface-side region and the second main surface-side region are the regions extending up to 100 nm inward on the electroconductive layer in the thickness direction of the electroconductive layer parallel to each side, on the first main surface S1 and second main surface S2, respectively.

The first main surface-side region has voids with long diameters of 80 nm or smaller. By having voids with long diameters of 80 nm or smaller it is possible to relax stress caused by expansion of copper, to provide resistance against heat shock. The long diameters are preferably 78 nm or smaller, more preferably 75 nm or smaller and even more preferably 65 nm or smaller. The volume ratio of voids with long diameters in this range (long diameters of 80 nm or smaller according to one aspect) with respect to the total voids is preferably 0.1% or greater, more preferably 0.2% or greater and even more preferably 0.3% or greater, from the viewpoint of stress relaxation. From the viewpoint of adhesiveness, the volume ratio is preferably 99% or lower, more preferably 98% or lower and even more preferably 97% or lower.

The property values for the present disclosure (more specifically, the porosity and elemental composition), are determined by analysis of a cross-section in the thickness direction of the electroconductive layer, based on the first main surface S1 and second main surface S2 of an electroconductive layer cross-section delimited in the manner described below using an SEM (scanning electron microscope) or STEM (scanning transmission electron microscope). Specifically, the first main surface S1 and second main surface S2 on the electroconductive layer cross-section are delimited according to the actual arithmetic mean roughnesses measured for the first main surface and second main surface. First, the arithmetic mean roughness is the value determined from a roughness curve obtained in an arbitrarily selected region with a 2 μm measuring length, on both the first main surface and second main surface, for a cross-section in the thickness direction of the electroconductive layer (cross-sectional observation being made possible by FIB processing). The maximum height, minimum height and mean line are calculated from this roughness curve. The first main surface S1 and second main surface S2 of the electroconductive layer cross-section are delineated by a line extending parallel to the mean line through a point at the maximum height (arithmetic mean roughness Ra of less than 1.0 μm), or a line extending parallel to the mean line through a point at the minimum height (arithmetic mean roughness Ra of 1.0 μm or greater), respectively.

The arithmetic mean roughness on the second main surface is not particularly limited but is preferably 10.0 μm or lower, more preferably 9.0 μm or lower and even more preferably 8.0 μm or lower, from the viewpoint of inhibiting variation in the resistance value of the conductor.

According to one aspect, the element ratio of oxygen atoms with respect to copper atoms in the first main surface-side region is preferably greater than the element ratio of oxygen atoms with respect to copper atoms in the second main surface-side region, from the viewpoint of obtaining satisfactory interlayer adhesiveness. The difference between the element ratio of oxygen atoms with respect to copper atoms in the first main surface-side region and the element ratio of oxygen atoms with respect to copper atoms in the second main surface-side region is preferably 0.001 or greater, more preferably 0.003 or greater, even more preferably 0.005 or greater and yet more preferably 0.01 or greater. From the viewpoint of easily forming an electroconductive layer, the difference may be 0.60 or lower, 0.55 or lower, 0.50 or lower or 0.45 or lower, for example.

According to one aspect, the element ratio of oxygen atoms with respect to copper atoms in the first main surface-side region is preferably greater than 0.025, from the viewpoint of obtaining an electroconductive layer with excellent adhesiveness. The element ratio of oxygen atoms with respect to copper atoms on the first main surface-side region is preferably 0.026 or greater, more preferably 0.027 or greater, even more preferably 0.028 or greater, yet more preferably 0.03 or greater, yet more preferably 0.05 or greater, yet more preferably 0.06 or greater, yet more preferably 0.07 or greater, yet more preferably 0.08 or greater, yet more preferably 0.09 or greater and most preferably 0.10 or greater. The element ratio may be 1.0 or lower, 0.9 or lower or 0.8 or lower, for example, from the viewpoint of ensuring satisfactory electro conductivity.

Preferred examples of constituent elements of the structure with an electroconductive pattern will now be described.

<Substrate>

The substrate is the main member of the structure with an electroconductive pattern. The material of the substrate is preferably an insulating material to ensure electrical insulation within the conductive pattern. However, the entire substrate does not necessarily need to be of an insulating material, and it is sufficient if the portion forming the side on which the electroconductive layer is disposed is of an insulating material.

The side of the substrate on which the electroconductive layer is disposed may be flat or curved, and may also include level differences. The electroconductive layer of the embodiment can be satisfactorily formed as wiring on the substrate, for example, even if the surface of the substrate is not flat.

According to one aspect, the substrate may be a basal plate (such as a plate, film or sheet) or a casing. A plate is a support used in a circuit board, such as a printed board. A film or sheet is a base film serving as a thin-film insulator, as used in a flexible printed board, for example. A casing is one with a three-dimensional shape which differs depending on the intended use. Examples of substrates that are three-dimensional manufactured goods (such as solids) include casings for electrical devices such as cell phone terminals, smartphones, smart glasses, televisions and personal computers. Other examples of solids include dash-boards, instrument panels, handles and chassis used in the field of automobiles.

The material of a substrate is not particularly restricted and may be either an inorganic material or an organic material.

Examples of inorganic materials include glass such as sodium lime glass, non-alkaline glass, boron silicate glass and quartz glass, and ceramic materials such as alumina.

Organic materials include polymer materials (such as resin films, paper and nonwoven fabrics). Resin films include polyimide (PI), polyesters (such as polyethylene terephthalate (PET), polyethylene naphthalate (PEN) and polybutylene terephthalate (PBT)), polyethersulfone (PES), polycarbonate(PC), polyvinyl alcohol (PVA), polyvinyl butyral (PVB), polyacetal (POM), polyallylate (PAR), polyamides (PA) (such as PA6 and PA66), polyamideimide (PAI), polyether imide (PEI), polyphenylene ether (PPE), modified polyphenylene ether (m-PPE), polyphenylene sulfide (PPS), polyether ketone (PEK), polyether ether ketone (PEEK), polyphthalamide (PPA), polyether nitrile (PEN), polybenzimidazole (PBI), polycarbodiimide, silicone polymer (polysiloxane), polymethacrylamide, nitrile rubber , acrylic rubber, polyethylene tetrafluoride, epoxy resin, phenol resin, melamine resin, urea resin, methyl polymethacrylate resin (PMMA), polybutene, polypentene, ethylene-propylene copolymer, ethylene-butene-diene copolymer, polybutadiene, polyisoprene, ethylene-propylene-diene copolymer, butyl rubber, butyl rubber , polymethylpentene (PMP), polystyrene(PS), styrene-butadiene copolymer, polyethylene (PE), polyvinyl chloride (PVC), polyvinylidene fluoride (PVDF), phenol-novolac, benzocyclobutene, polyvinylphenol, polychloropyrene, polyoxymethylene, polysulfone (PSF), polyphenylsulfone resin (PPSU), cycloolefin polymer (COP), acrylonitrile-butadiene-styrene resin (ABS), acrylonitrile-styrene resin (AS), polytetrafluoroethylene (PTFE) and polychlorotrifluoroethylene (PCTFE). PI, PET and PEN are particularly preferred from the viewpoint of flexibility and cost. The thickness of the substrate may be 1 μm to 10 mm, for example, and is preferably 25 μm to 250 μm. The thickness of the substrate is preferably 250 μm or smaller, because the electronic device that is fabricated will be able to be rendered lightweight, compact and flexible.

Paper includes common paper obtained from pulp starting materials (traditional paper types such as woodfree paper, wood containing paper, coated paper, cardboard and corrugated board), and paper obtained from cellulose nanofiber starting materials. Dissolved polymer materials, and composite substrates comprising sol-gel materials impregnated and cured or laminated on paper, may also be used. Examples include composite substrates of paper and phenol resins, composite substrates of paper and epoxy resins, composite substrates of paper and glass composites, composite substrates of paper and glass epoxy materials, composite substrates of paper and TEFLON®, composite substrates of paper and alumina, composite substrates of paper and low-temperature, low-humidity co-fired ceramics (LTCC), and composite substrates of paper and silicon wafers.

<Electroconductive Layer>

The electroconductive layer is a layer that includes copper (as a conductive metal). The electroconductive layer may be wiring, a heat dissipating sheet metal layer (in the form of a sheet (such as a solid metal film) or mesh), an electromagnetic shield metal layer (in the form of a sheet or mesh), or an antenna, with no particular restrictions to these. Wiring may be wiring for connection of multiple parts, disposed on a support, printed circuit board wiring, integrated circuit wiring, or wiring for connection between electrical devices or electronic devices (for example, wiring between devices such as switches and lightings in vehicles such as automobiles, or wiring between sensors and ECUs (Electronic Control Units)), with no particular restrictions to these.

Referring to FIG. 1, the electroconductive layer 12 may have a third region R3 between the first main surface-side region and the second main surface-side region. According to one aspect, at least part of the third region may have the same properties as the first main surface-side region or the second main surface-side region. Here, "same properties" means that the value of the element ratio and/or porosity is within ±3.0% of the value in the first main surface-side region or second main surface-side region. Referring to FIG. 1, the third region R3 may have a location R31 that is continuous with the region R1 on the first main surface and has the same properties as the region R1 on the first main surface (hereunder also referred to simply as location R31), a location R32 that is continuous with the region R2 on the second main surface and has the same properties as the region R2 on the second main surface (hereunder also referred to simply as location R2), and another location R33 (hereunder also referred to simply as location R33), or it may be occupied by location R31 and location R32. The properties may also be continuously changing from location R31 toward location R33, and further toward location 32.

The first main surface-side region and second main surface-side region can be formed by a method of producing a structure with an electroconductive pattern described below. When the third region R3 has location R31, the location R31 can be formed simultaneously with the region R1 on the first main surface. Similarly, when the third region R3 has location R32, the location R32 can be formed simultaneously with the region R2 on the second main surface.

From the viewpoint of adhesiveness between the substrate and electroconductive layer, the element ratio (based on atomic number) of the first main surface-side region is preferably Cu/O/Ni/S=100/(1.0-35.0)/(0.1-3.0)/(0.1-3.0), more preferably Cu/O/Ni/S=100/(1.0-30.0)/(0.1-3.0)/(0.1-3.0), even more preferably Cu/O/Ni/S=100/(1.0-25.0)/(0.1-3.0)/(0.1-3.0), yet more preferably Cu/O/Ni/S=100/(1.0-20.0)/(0.1-3.0)/(0.1-3.0) or Cu/O/Ni/S=100/(1.0-4.0)/(0.1-3.0)/(0.1-3.0), yet more preferably Cu/O/Ni/S=100/(1.5-3.5)/(0.2-2.5)/(0.2-2.5), and even yet more preferably Cu/O/Ni/S=100/(1.8-3.2)/(0.3-2.0)/(0.2-2.0).

From the viewpoint of chemical resistance, the element ratio in the second main surface-side region is preferably Cu/O/S=100/(0.1-4.0)/(0.1-3.0), more preferably Cu/O/S=100/(0.2-3.5)/(0.2-2.5) and even more preferably Cu/O/S=100/(0.3-3.0)/(0.3-2.0).

The element concentrations in the electroconductive layer are the values obtained by consolidating the electroconductive layer on an epoxy resin and subsequently processing with an FIB (focused ion beam) to allow cross-section analysis using a STEM (scanning transmission electron microscope), and using EDX (energy dispersive X-ray analysis) to analyze the elemental composition in a 2 µm×100 nm rectangular range in a range from the first main surface to a depth of 100 nm in the thickness direction of the electroconductive layer and in a range that extends from the second main surface to a depth of 100 nm in the thickness direction of the electroconductive layer, in an electroconductive layer portion of the sample.

The respective element ratios in the first main surface-side region and second main surface-side region can be controlled, for example, by adjusting the dispersion composition and plating solution composition as explained below.

The first main surface-side region preferably comprises copper (non-oxidized metallic copper) or essentially consists of copper. According to one aspect, the copper is in sintered form. According to another aspect the copper is reduced copper. As used herein, "reduced copper" means a sintered body obtained by reducing and sintering copper oxide. Reduced copper is advantageous for adhesiveness between the substrate and electroconductive layer.

The reduced copper can be formed by irradiating laser light onto a coated film comprising a material coated on the electroconductive layer. The laser light irradiation may be by light firing, for example. According to one aspect, the laser light is selectively irradiated only onto a partial region of the coated film to form a desired conductive pattern.

Light firing can be accomplished using a flash light system or laser light system with a xenon discharge tube, for example, as the light source. Such a method is carried out by short-period exposure of high-intensity light, application of copper oxide ink onto a substrate and temperature increase for firing, resulting in copper oxide reduction, copper particle sintering, integration and organic component decomposition to form a copper-containing film as an electroconductive film. Since the firing time is extremely short there is little damage to the substrate, allowing application to resin film substrates with low heat resistance.

In a flash light system, as a system wherein a xenon discharge tube is used for instant discharge of a charged condenser, the method employed is one in which a large level of pulsed light is generated and irradiated onto copper oxide ink formed on the substrate to instantly heat the copper oxide to high temperature, converting it to a copper-containing film as an electroconductive film. The exposure dose can be adjusted by the light intensity, luminescence time, photoirradiation interval and number of exposures, and increasing the optical transparency of the substrate makes it possible to form a conductive pattern with copper oxide ink even onto a resin substrate with low heat resistance such as PET, PEN or paper.

The thickness of the electroconductive layer is preferably 0.5 µm to 50 µm and more preferably 1 µm to 35 µm.

According to one aspect, the structure with an electroconductive pattern may comprise nickel and/or gold on the second main surface of the electroconductive layer. If the second main surface comprises nickel and/or gold it will be possible to prevent oxidation of the conductive pattern while also improving attachment of soldering. The nickel and/or gold content is not particularly restricted, but from the viewpoint of preventing oxidation it is preferably 1 mass % or greater, more preferably 2 mass % or greater and more preferably 3 mass % or greater, while from the viewpoint of low internal stress and excellent adhesiveness it is preferably 100 mass % or lower, 99 mass % or lower or 98 mass % or lower, as the total for nickel and gold. The amount of nickel or gold on the second main surface is the value measured by cross-sectional SEM-EDX on the second main surface.

<Resin>

According to one aspect, the structure with an electroconductive pattern may further comprise a resin (such as the resin 13 in FIG. 1). According to another aspect, a portion of the electroconductive layer is preferably covered with a resin. Covering a portion of the electroconductive layer with a resin prevents oxidation of the conductive pattern and improves the reliability. Providing a non-resin-coated portion on the electroconductive layer will also allow electrical connection with other parts.

A sealing material layer is an example of such a resin layer. The resin layer can be formed by transfer molding, compression molding, photopolymerization, thermosetting or casting, for example. Examples of resins to be used include polypropylene (PP), polyimide (PI), polyesters (such as polyethylene terephthalate (PET), polyethylene naphthalate (PEN) and polybutyl terephthalate (PBT)), polyether sulfone (PES), polycarbonate (PC), polyvinyl alcohol (PVA), polyvinyl butyral (PVB), polyacetal (POM), polyallylate (PAR), polyamide (PA) (such as PA6 and PA66), polyamideimide (PAI), polyetherimide (PEI), polyphenylene ether (PPE), modified polyphenylene ether (m-PPE), polyphenylene sulfide (PPS), polyether ketone (PEK), polyether ether ketone (PEEK), polyphthalamide (PPA), polyether nitrile (PEN), polybenzimidazole (PBI), polycarbodiimide, silicone polymer (polysiloxane), polymethacrylamide, nitrile rubber, acrylic rubber, polyethylene tetrafluoride, epoxy resin, phenol resin, melamine resin, urea resin, methyl polymethacrylate resin (PMMA), acrylate resin, polybutene, polypentene, ethylene-propylene copolymer, ethylene-butene-diene copolymer, polybutadiene, polyisoprene, ethylene-propylene-diene copolymer, butyl rubber , polymethylpentene (PMP), polystyrene (PS), styrene-butadiene copolymer, polyethylene (PE), polyvinyl chloride (PVC), polyvinylidene fluoride (PVDF), phenolnovolac, benzocyclobutene, polyvinylphenol, polychloropyrene, polyoxymethylene, polysulfone (PSF), polyphenylsulfone resin (PPSU), cycloolefin polymer (COP), acrylonitrile-butadiene-styrene resin(ABS), acrylonitrile-styrene resin (AS), polytetrafluoroethylene (PTFE) and polychlorotrifluoroethylene (PCTFE). The resin layer preferably includes a hydroxyl group. Hydroxyl groups improve adhesiveness onto copper foils. The preferred thickness for the resin layer is 0.1 µm to 1 mm, or 0.5 µm to 800 µm.

The sealing material layer protects the conductive pattern in the produced finished product (the structure with an electroconductive pattern itself or the product containing it) from external stress, helping to increase the long-term stability of the structure with an electroconductive pattern.

The moisture permeability of a sealing material layer as an example of a resin layer is preferably 1.0 $g/m^2/day$ or lower, more preferably 0.8 $g/m^2/day$ or lower and even more preferably 0.6 $g/m^2/day$ or lower, from the viewpoint of ensuring satisfactory long-term stability. By lowering the moisture permeability it is possible to prevent contamination of the sealing material layer by external moisture and inhibit oxidation of the conductive pattern. While lower moisture permeability is preferred, it is preferably 0.1 $g/m^2/day$ or greater or 0.5 $g/m^2/day$ or greater from the viewpoint of facilitating production of the sealing material layer. The moisture permeability is the value measured by the cup method.

The sealing material layer may be a functional layer that provides an oxygen barrier function to the structure with an electroconductive pattern even after detachment of the oxygen barrier layer used during production, or other functions such as damage resistance during handling of the structure with an electroconductive pattern, antifouling properties to protect the structure with an electroconductive pattern from external fouling, or increased stiffness for the structure with an electroconductive pattern when using tough resins.

<Solder Layer>

According to one aspect, preferably a solder layer is formed on a portion of the surface of the electroconductive layer, and especially a portion of the second main surface. The electroconductive layer is connected with other members by the solder layer. The solder layer can be formed by a reflow method, for example. The solder layer may be a Sn—Pb based, Pb—Sn—Sb based, Sn—Sb based, Sn—Pb—Bi based, Bi—Sn based, Sn—Cu based, Sn—Pb—Cu based, Sn—In based, Sn—Ag based, Sn—Pb—Ag based or Pb—Ag based solder layer. The solder layer preferably also comprises a flux component. The flux component preferably includes an activating agent containing a carboxylic acid group. Such a structure increases adhesiveness between the electroconductive layer and solder layer. According to one aspect, the solder layer may be infiltrating in the void sections of the electroconductive layer. If the solder layer is infiltrating in the void sections of the electroconductive layer, adhesiveness with the electroconductive layer will increase. The thickness of the solder layer is preferably 0.1 µm to 2 mm and more preferably 0.5 µm to 1 mm.

<Method for Producing Structure with Electroconductive Pattern>

One aspect of the invention provides a method for producing a structure with an electroconductive pattern. According to one aspect, the method includes a coated film-forming step in which a dispersion containing copper oxide particles is coated onto a substrate to obtain a coated film, a drying step in which the coated film is dried, an exposure step in which the coated film after the drying step is exposed to laser light to obtain a copper-containing film, and a plating step in which the copper-containing film is plated to obtain an electroconductive layer including the copper-containing film and a plating layer. According to another aspect, a developing step in which the laser light-unexposed sections of the coated film are removed is included between the exposure step and the plating step.

In this method, the coated film is fired by laser light irradiation to allow formation of a reduced copper layer in the desired pattern, so that the productivity can be improved compared to methods using conventional photoresists. The reduced copper produced in this manner also has a high surface area, allowing for a faster growth rate for the plating on the copper-containing film. According to one aspect, a second main surface-side region with a relatively low porosity can be formed by plating, whereby the resistance of the structure with an electroconductive pattern can be lowered. The specific method will be described below, but the method of this embodiment can produce reduced copper simply by irradiation of laser light, and the patterns can be conveniently altered for different products without requiring conventional masks or printing plates. The method of this embodiment is advantageous in that it allows wirings to be satisfactorily fabricated without constraints on the substrate form (even for solid substrates).

Preferred examples for each step will now be explained.

<Coated Film-Forming Step>

For this step, a dispersion containing copper oxide particles (also referred to herein as "copper oxide ink") is coated onto a substrate to obtain a coated film.

[Dispersion Containing Copper Oxide Particles]

The dispersion (copper oxide ink) comprises copper oxide particles and a dispersing medium, and according to one aspect it further comprises a dispersant and/or a reducing agent.

(Copper Oxide)

The copper oxide may be cuprous oxide ($Cu_2O$) or cupric oxide (CuO), with cuprous oxide being preferred. Cuprous oxide is an easily reduced metal oxide that sinters easily even in microparticulate form, while copper is also more inexpensive than precious metals such as silver and is less likely to migrate, and either commercial or synthetic copper oxide products may be used.

The following methods are examples of methods for synthesis of cuprous oxide.

(1) A method of adding a water/copper acetylacetonate complex in a polyol solvent and heating the organic copper compound to dissolution, and then adding water as necessary to the reaction and increasing the temperature for heating to the reduction temperature of the organic copper, as heat reduction.

(2) A method of heating an organic copper compound (such as a copper-N-nitrosophenylhydroxyamine complex) in an inert atmosphere in the presence of a protective agent such as hexadecylamine, at a high temperature of about 300° C.

(3) A method of reducing a copper salt dissolved in an aqueous solution using hydrazine.

Of these, the method of (3) is preferred as a convenient procedure that can yield cuprous oxide with a small mean particle size.

Methods of synthesizing cupric oxide include the following.

(1) A method of adding sodium hydroxide to a cupric chloride or copper sulfate aqueous solution to form copper hydroxide, and then heating it.

(2) A method of heating copper nitrate, copper sulfate, copper carbonate or copper hydroxide in air at a temperature of 600° C. for thermal decomposition.

The method of (1) is preferred to obtain cupric oxide with a small particle size.

Separation of the product solution and copper oxide after completion of the synthesis may be carried out by a known method such as centrifugal separation. The dispersing medium described below and optionally a dispersant as described below are added to the obtained copper oxide, and the mixture is stirred and dispersed by a known method using a homogenizer or the like. Depending on the dispersing medium the copper oxide may be difficult to disperse, resulting in inadequate dispersion, in which case an alcohol (such as butanol) in which copper oxide easily disperses may be used as a dispersing medium for dispersion of the copper oxide, followed by replacement with a desired dispersing medium and concentration to the desired concentration, to obtain a satisfactory dispersion of the copper oxide in the desired dispersing medium. An example is a method of repeating concentration with a UF membrane and dilution and concentration with an appropriate dispersing medium. The copper oxide dispersion obtained in this manner is used for coating, such as printing.

According to one aspect, the copper oxide is in fine particulate form, with a mean particle size of preferably 3 nm to 50 nm and more preferably 5 nm to 40 nm. The mean particle size is the particle size when dispersed in a dispersion, and it is the value measured by the cumulant method using an FPAR-1000 by Otsuka Electronics Co., Ltd. The mean particle size is not limited to the primary particle size and may be the secondary particle size instead. A mean particle size of 50 nm or smaller is preferred as it will allow low temperature firing, and will widen the general utility of the substrate and help facilitate formation of a fine pattern on the substrate. A size of 3 nm or greater is also preferred for satisfactory dispersion stability of the copper oxide particles in the dispersion, satisfactory long-term storage stability of the dispersion and ability to form a uniform thin-film.

The mass ratio of copper oxide in 100 mass % of the dispersion is preferably 5 mass % or greater, 10 mass % or greater or 15 mass % or greater, and preferably 60 mass % or lower, 55 mass % or lower or 50 mass % or lower.

(Dispersing Medium)

The dispersing medium is one that is capable of dispersing copper oxide particles. According to one aspect, the dispersing medium is able to disperse a dispersant. The volatility of the dispersing medium has an effect on workability from the viewpoint of forming a conductive pattern using copper oxide ink. The dispersing medium is preferably one suited for a conductive pattern-forming method, such as a coating system (such as printing). In other words, the dispersing medium is preferably selected in consideration of the desired dispersibility and coating (printing) manageability.

Dispersing media to be used include alcohols (monohydric alcohols and polyhydric alcohols (such as glycols)), alcohol (e.g. glycol) ethers, and alcohol (e.g. glycol) esters. Specific examples of dispersing media include propyleneglycol monomethyl ether acetate, 3-methoxy-3-methylbutyl acetate, ethoxyethyl propionate, propyleneglycol monomethyl ether, propyleneglycol monoethyl ether, propyleneglycol monopropyl ether, propyleneglycol tertiary butyl ether, dipropyleneglycol monomethyl ether, ethyleneglycol butyl ether, ethyleneglycol ethyl ether, ethyleneglycol methyl ether, ethylene glycol, 1,2-propylene glycol, 1,3-butylene glycol, 2-pentanediol, 2-methylpentane-2,4-diol, 2,5-hexanediol, 2,4-heptanediol, 2-ethylhexane-1,3-diol, diethylene glycol, hexanediol, octanediol, triethylene glycol, tri-1,2-propylene glycol, glycerol, ethyleneglycol monohexyl ether, diethyleneglycol monoethyl ether, diethyleneglycol monobutyl ether, ethyleneglycol monobutyl acetate, diethyleneglycol monoethyl ether acetate, methanol, ethanol, n-propanol, i-propanol, n-butanol, i-butanol, 2-butanol, t-butanol, n-pentanol, i-pentanol, 2-methylbutanol, 2-pentanol, t-pentanol, 3-methoxybutanol, n-hexanol, 2-methylpentanol, 1-hexanol, 2-hexanol, 2-ethylbutanol, 1-heptanol, 2-heptanol, 3-heptanol, n-octanol, 2-ethylhexanol, 2-octanol, n-nonyl alcohol, 2,6-dimethyl-4-heptanol, n-decanol, cyclohexanol, methylcyclohexanol, 3,3,5-trimethylcyclohexanol, benzyl alcohol and diacetone alcohol. These may be used alone or in mixtures of different types, selecting the vaporizability, coating equipment and the solvent resistance of the substrate as appropriate for the coating system used.

The dispersing medium is more preferably a monoalcohol of 10 or fewer carbon atoms. From the viewpoint of inhibiting reduction in copper oxide dispersibility and achieving a more stable dispersion of copper oxide by interaction between the dispersing medium and dispersant, the number of carbon atoms of the monoalcohol is more preferably 8 or lower. A monoalcohol with 8 or fewer carbon atoms is also advantageous from the viewpoint of reducing the resistance value of the copper-containing film. Ethanol, n-propanol, i-propanol, n-butanol, i-butanol, sec-butanol and t-butanol are more preferred among monoalcohols of 8 or fewer carbon atoms, in terms of dispersibility, volatility and viscosity suitable for dispersion coating. These monoalcohols may be used alone, or more than one may be used in admixture.

The dispersing medium content is preferably 30 mass % to 95 mass %, more preferably 40 mass % to 95 mass % and most preferably 50 mass % to 90 mass % of the entire dispersion.

(Dispersant)

The dispersant used may be a compound that is able to disperse copper oxide in the dispersing medium. The number-average molecular weight of the dispersant is preferably 300 to 300,000, 350 to 200,000 or 400 to 150,000. The number-average molecular weight, for the purpose of the present disclosure, is the value determined in terms of standard polystyrene in gel permeation chromatography. If the number-average molecular weight is 300 or greater, the insulating property will be excellent and will tend to contribute to greater dispersion stability of the dispersion, while it is also preferably 300,000 or lower in order to facilitate firing in the exposure step. The dispersant preferably has a group with affinity for copper oxide, from which viewpoint a phosphorus-containing organic compound is preferred and a phosphoric acid group-containing organic compound is especially preferred. A preferred example of a phosphorus-containing organic compound is a polymer phosphoric acid ester. Preferred examples of polymer phosphoric acid esters include those having the structure represented by the following chemical formula (1):

[Chemical Formula 1]

Chemical Formula (1)

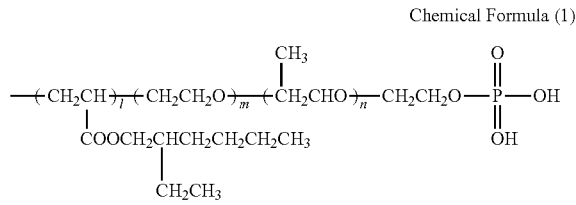

(where l is an integer of 1 to 10,000, m is an integer of 1 to 10,000 and n is an integer of 1 to 10,000), because of its excellent adsorption onto copper oxide and especially cuprous oxide, and excellent adhesiveness onto substrates.

In chemical formula (1), l is more preferably 1 to 5000 and even more preferably 1 to 3000.

In chemical formula (1), m is more preferably 1 to 5000 and even more preferably 1 to 3000.

In chemical formula (1), n is more preferably 1 to 5000 and even more preferably 1 to 3000.

The phosphorus-containing organic material is preferred to be one that decomposes or vaporizes under light or heat, because it will be less likely to leave organic residue after firing and can form a conductive pattern with low resistivity. According to one aspect, the decomposition temperature of the phosphorus-containing organic material is preferably 600° C. or lower, more preferably 400° C. or lower and even more preferably 200° C. or lower. The decomposition temperature may be 50° C. or higher, 80° C. or higher or 100° C. or higher from the viewpoint of facilitating selection of a dispersant with an excellent effect of improving the dispersion stability of the dispersion. According to one aspect, the boiling point of the phosphorus-containing organic material is preferably 300° C. or lower, more preferably 200° C. or lower and even more preferably 150°

C. or lower. The boiling point may also be 30° C. or higher, 50° C. or higher or 80° C. or higher. For the purpose of the present disclosure the decomposition temperature is the value measured by thermogravimetric differential thermal analysis.

According to one aspect, the phosphorus-containing organic material is preferably able to absorb the light used for firing of the copper oxide. According to a mode in which laser light is used as the light source for firing, a phosphorus-containing organic material that absorbs light having the luminous wavelength of the laser light (such as 355 nm, 405 nm, 445 nm, 450 nm, 532 nm and/or 1056 nm) is preferred. When the substrate is a resin, for example, the phosphorus-containing organic material preferably absorbs light with a wavelength of 355 nm, 405 nm, 445 nm and/or 450 nm.

A publicly known dispersant may be used. Examples include polymers having basic groups, such as long-chain polyaminoamide and polar acid ester salts, unsaturated polycarboxylic acid polyaminoamides, polycarboxylic acid salts of polyaminoamides, long-chain polyaminoamide and acid polymer salts. Alkylammonium salts, amine salts and amide-amine salts of polymers such as acrylic-based (co) polymers, modified polyester acids, polyether ester acids, polyether-based carboxylic acids and polycarboxylic acids may also be mentioned. Commercially available products may also be used for such dispersants.

Examples of commercial products include DISPERBYK®-101, DISPERBYK-102, DISPERBYK-110, DISPERBYK-111, DISPERBYK-112, DISPERBYK-118, DISPERBYK-130, DISPERBYK-140, DISPERBYK-142, DISPERBYK-145, DISPERBYK-160, DISPERBYK-161, DISPERBYK-162, DISPERBYK-163, DISPERBYK-2155, DISPERBYK-2163, DISPERBYK-2164, DISPERBYK-180, DISPERBYK-2000, DISPERBYK-2025, DISPERBYK-2163, DISPERBYK-2164, BYK-9076, BYK-9077, TERRA-204 and TERRA-U (all by Byk-Chemie Corp.), FLOWLEN DOPA-15B, FLOWLEN DOPA-15BHFS, FLOWLEN DOPA-22, FLOWLEN DOPA-33, FLOWLEN DOPA-44, FLOWLEN DOPA-17HF, FLOWLEN TG-662C and FLOWLEN KTG-2400 (all by Kyoeisha Chemical Co., Ltd.), ED-117, ED-118, ED-212, ED-213, ED-214, ED-216, ED-350 and ED-360 (all by Kusumoto Chemicals, Ltd.), and PLYSURF M208F and PLYSURF DBS (by Dai-ichi Kogyo Seiyaku Co., Ltd.). They may be used alone, or two or more may be used in admixture.

The acid value (mgKOH/g) of the dispersant is preferably 20 to 130 and more preferably 30 to 100. The acid value is preferably within this range for satisfactory dispersion stability of the dispersion. An acid value in this range is especially effective when the copper oxide has a small mean particle size. Specific compounds include "DISPERBYK-102" (acid value: 101), "DISPERBYK-140" (acid value: 73), "DISPERBYK-142" (acid value: 46), "DISPERBYK-145" (acid value: 76), "DISPERBYK-118" (acid value: 36) and "DISPERBYK-180" (acid value: 94), by Byk-Chemie Corp.

The difference between the amine value (mgKOH/g) and acid value of the dispersant ([amine value]−[acid value]) is preferably −50 to 0. The amine value represents the number of total free bases and free base sites while the acid value represents the total number of free fatty acids and free fatty acid sites. The amine value and acid value are measured by the methods of JIS K 7700 and ASTM D2074, respectively. The value of [amine value]−[acid value] is −50 to 0 for satisfactory dispersion stability of the dispersion. The value of [amine value]−[acid value] is more preferably −40 to 0 and even more preferably −20 to 0.

The dispersant content may be adjusted to be proportional to the amount of copper oxide, in consideration of the required dispersion stability. The mass ratio of the dispersant with respect to the copper oxide in the dispersion (dispersant mass/copper oxide mass) is preferably 0.0050 to 0.30, more preferably 0.050 to 0.25 and even more preferably 0.10 to 0.23. The amount of dispersant affects the dispersion stability of the dispersion, with a lower amount tending to result in aggregation of the copper oxide and a higher amount tending to increase the dispersion stability of the dispersion. However, a dispersant content of 35 mass % or lower in the dispersion reduces the effects of residue from the dispersant in the copper-containing film obtained after firing and can improve the electroconductivity. According to one aspect, the amount of dispersant is preferably 0.5 mass % or greater, 0.8 mass % or greater or 1.0 mass % or greater, and preferably 35 mass % or lower, 30 mass % or lower or 25 mass % or lower, in 100 mass % of the dispersion.

(Reducing Agent)

The dispersion may further comprise a reducing agent. Reducing agents include hydrazine, hydrazine hydrate, sodium, sodium borohydride, potassium iodide, sulfites, sodium thiosulfate, formic acid, oxalic acid, ascorbic acid, iron(II) sulfide, tin(II) chloride, diisobutyl aluminum hydride and carbon. For firing treatment, hydrazine and hydrazine hydrate are most preferred as reducing agents from the viewpoint of contributing to reduction of copper oxide and especially cuprous oxide, and forming a lower-resistance reduced copper layer (copper-containing film). Hydrazine and hydrazine hydrate are also advantageous for maintaining the dispersion stability of the dispersion.

The reducing agent content may be adjusted to be proportional to the amount of copper oxide, in consideration of the required reducing power. According to one aspect, the mass ratio of the reducing agent with respect to copper oxide in the dispersion (reducing agent mass/copper oxide mass) is preferably 0.0001 to 0.1, more preferably 0.0001 to 0.05 and even more preferably 0.0001 to 0.03. The mass ratio of the reducing agent is preferably 0.0001 or greater from the viewpoint of satisfactory dispersion stability of the dispersion and low resistance of the reduced copper layer, while 0.1 or lower will result in satisfactory long-term stability of the dispersion.

(Relationship Between Copper Oxide and Dispersant in Dispersion)

Figure 2:
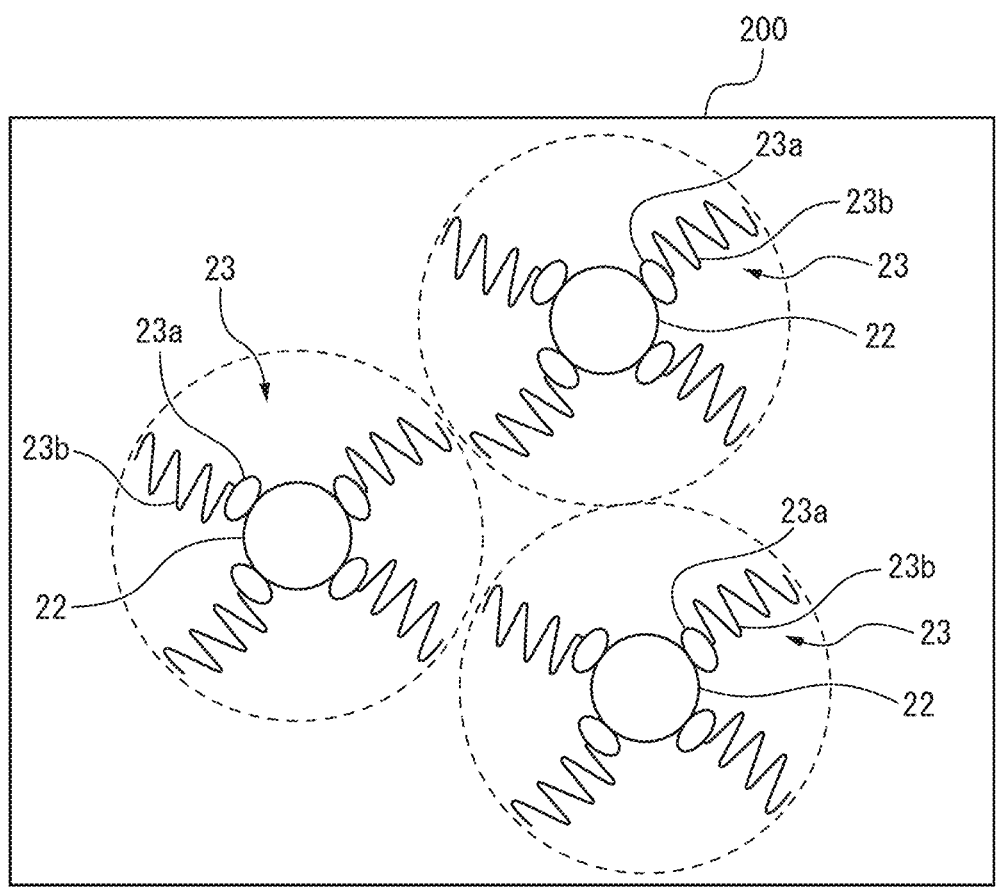
FIG. 2 is a cross-sectional schematic drawing showing the relationship between copper oxide and a phosphoric acid ester salt in a dispersion to be used for one aspect of the invention.

FIG. 2 is a cross-sectional schematic drawing showing the relationship between copper oxide and a phosphoric acid ester salt in a dispersion (copper oxide ink) to be used for one aspect of the invention. Referring to FIG. 2, when the copper oxide ink 200 comprises copper oxide 22 and a phosphoric acid ester salt 23 (as the dispersant), the phosphoric acid ester salt 23 surrounds the periphery of the copper oxide 22 with phosphorus 23a facing inward and the ester salt 23b facing outward. Since the phosphoric acid ester salt 23 exhibits an electrical insulating property, electrical conduction between adjacent copper oxide 22 molecules is hindered by the phosphoric acid ester salt 23. The phosphoric acid ester salt 23 inhibits aggregation of the copper oxide ink 200 by steric hindrance. Therefore, while the copper oxide 22 is a semiconductor (with a certain degree of electroconductivity), it is covered by the electrical insulating phosphoric acid ester salt 23 and consequently the copper oxide ink 200 exhibits an electrical insulating property. The regions of the conductive pattern separated apart by the copper oxide ink 200 can be insulated by the copper oxide ink 200.

In the conductive pattern regions (the regions of the coated film fired by photoirradiation), the copper oxide 22 is reduced to copper while the adjacent copper oxide 22 is fired and integrated together. This results in formation of conductive pattern regions with excellent electrical conductivity. When a phosphorus-containing organic material has been used as the dispersant, phosphorus element remains in the conductive pattern regions. The phosphorus element exists as simple elemental phosphorus, phosphorus oxides and/or phosphorus-containing organic materials. Such residual phosphorus, however, usually exists in segregated form in the conductive pattern regions and therefore does not risk increasing the resistance in the conductive pattern regions.

[Formation of Coated Film]

The method of coating the dispersion may be a printing method such as screen printing, intaglio direct printing, intaglio offset printing, flexographic printing, offset printing, ink jet printing or reverse transfer printing, or a dispenser drawing method. The coating can be carried out using a method such as die coating, spin coating, slit coating, bar coating, knife coating, spray coating or dip coating.

The layer thickness after drying of the coated film is preferably 1 nm to 10,000 nm, more preferably 10 nm to 8000 nm and even more preferably 100 nm to 7000 nm, from the viewpoint of allowing formation of a uniform reduced copper layer.

<Drying Step>

In this step, the coated film obtained in the coated film-forming step is dried. The drying step is a step used to gasify the dispersing medium. The dispersing medium may be gasified at room temperature or by a method such as oven or vacuum drying. In consideration of the heat resistance of the substrate, drying is preferably at a temperature of 150° C. or lower and more preferably a temperature of 100° C. or lower.

<Exposure Step>

In this step, the coated film after the drying step is exposed to laser light to obtain a copper-containing film. The copper oxide particles in the coated film are reduced to produce copper, and fusion and integration of the copper itself can form a copper-containing film (reduced copper layer). When the dispersion contains copper particles, fusion and integration also takes place between the copper particles and the reduced copper. A copper-containing film is thus formed.

The wavelength of the laser light may be freely selected in consideration of the absorption wavelength of the dispersion and substrate. The exposure may be carried out by beam scanning using a laser, and the range of exposure may be easily adjusted so that exposure is over the entire surface of the substrate, or is selective partial exposure. The type of laser used may be YAG (yttrium-aluminum-garnet), YVO (yttrium vanadate), Yb (ytterbium), a semiconductor laser (GaAs, GaAlAs, GaInAs) or carbon dioxide gas, and instead of only the fundamental wave it may employ an extracted higher harmonic.

The center wavelength of the laser light is preferably 300 nm to 1500 nm. For example, a center wavelength of 355 nm to 532 nm is preferred because it is included in the absorption wavelength of a copper oxide-containing coated film. When the substrate is a resin, the center wavelength of the laser light is most preferably 355 nm, 405 nm, 445 nm, 450 nm or 532 nm. From the viewpoint of interlayer adhesiveness of the structure with an electroconductive pattern, the center wavelength is preferably 355 nm or 532 nm. By selecting such wavelengths it is possible to easily fabricate a copper-containing film with the desired porosity by forming prescribed voids. It is also possible to control the porosity of the copper-containing film by adjusting the output and speed of the laser irradiated onto the coated film. For example, reducing the scanning speed of the laser can help lower the porosity.

According to one aspect, the laser light is irradiated onto a partial region of the coated film. Selective irradiation of laser light may be, for example, by irradiating the coated film with light rays through a mask from a laser light system, or direct writing of a desired pattern onto the coated film by beam scanning from a laser light system. The irradiation is preferably carried out in a non-oxidizing atmosphere from the viewpoint of avoiding copper oxidation. The surface to be irradiated with the laser light may be flat or non-flat, and the substrate may be a solid casing, for example.

(Optional Washing)

Following laser irradiation, the unfired regions may be removed using an appropriate washing solution. In this case only the fired regions remain on the substrate. The unfired regions may also be left with the firing regions, without removal by a washing step. Either method can produce a substrate with conductive properties provided by fired regions in the form of a conductive pattern (hereunder also referred to as conductive substrate).

The washing solution for washing may be a liquid that disperses or dissolves copper oxide. Specific examples of dispersing media include water, propyleneglycol monomethyl ether acetate, 3-methoxy-3-methyl-butyl acetate, ethoxyethyl propionate, propyleneglycol monomethyl ether, propyleneglycol monoethyl ether, propyleneglycol monopropyl ether, propyleneglycol tertiary butyl ether, dipropyleneglycol monomethyl ether, ethyleneglycol butyl ether, ethyleneglycol ethyl ether, ethyleneglycol methyl ether, ethylene glycol, 1,2-propylene glycol, 1,3-butylene glycol, 2-pentanediol, 2-methylpentane-2,4-diol, 2,5-hexanediol, 2,4-heptanediol, 2-ethylhexane-1,3-diol, diethylene glycol, hexanediol, octanediol, triethylene glycol, tri-1,2-propylene glycol, glycerol, ethyleneglycol monohexyl ether, diethyleneglycol monoethyl ether, diethyleneglycol monobutyl ether, ethyleneglycol monobutyl acetate, diethyleneglycol monoethyl ether acetate, methanol, ethanol, n-propanol, i-propanol, n-butanol, i-butanol, 2-butanol, t-butanol, n-pentanol, i-pentanol, 2-methylbutanol, 2-pentanol, t-pentanol, 3-methoxybutanol, n-hexanol, 2-methylpentanol, 1-hexanol, 2-hexanol, 2-ethylbutanol, 1-heptanol, 2-heptanol, 3-heptanol, n-octanol, 2-ethylhexanol, 2-octanol, n-nonyl alcohol, 2,6-dimethyl-4-heptanol, n-decanol, cyclohexanol, methylcyclohexanol, 3,3,5-trimethylcyclohexanol, benzyl alcohol, diacetone alcohol and acetone. These solvents are preferred to allow the copper oxide to be satisfactory washed off when the dispersant is present in the coated film. The solvent is most preferably water, ethanol, butanol, i-propanol or acetone. The dispersant may also be added to the washing solution. The dispersant used may be any of those mentioned above, and is more preferably a phosphorus-containing organic material.

The copper-containing film after the laser light exposure step preferably has a porosity of 0.5 vol % or greater. Such a porosity will allow the plating solution to easily permeate during the subsequent plating step and will improve the plating adhesion, resulting in satisfactory adhesiveness. The porosity is more preferably 0.7 vol % or greater, more preferably 1.0 vol % or greater, even more preferably 1.5 vol % or greater, even more preferably 2.0 vol % or greater and yet more preferably 2.5 vol % or greater. From the viewpoint of adhesiveness between the copper-containing film and the substrate, the porosity is preferably 60 vol % or lower, more preferably 58 vol % or lower, even more preferably 55 vol % or lower, yet more preferably 53 vol % or lower and most preferably 51 vol % or lower.

<Degreasing Step>

According to one aspect, the method of the present disclosure may further comprise a degreasing step in which the copper-containing film is degreased. The degreasing method may be a UV method or a wet degreasing method. The degreasing step increases the subsequent growth rate of the plating and improves productivity. The step contributes to a lower porosity of the electroconductive layer after plating, or in other words, to the final porosity of the electroconductive layer.

From the viewpoint of interlayer adhesiveness of the structure with an electroconductive pattern, the degreasing step is preferably carried out by immersing the conductive substrate in a degreasing solution comprising a compound with an amino group. Compounds with amino groups include amino acids such as alanine, arginine, asparagine, cysteine, glutamine, glycine, histidine, isoleucine, leucine, lysine, methionine, phenylalanine, proline, serine, threonine, tryptophan, tyrosine and valine, alkylamines such as methylamine, dimethylamine, ethylamine, trimethylamine, diethylamine, triethylamine, propylamine, isopropylamine and diisopropylamine, alkanolamines such as 2-aminoethanol, diethanolamine, triethanolamine, N-methylethanolamine and N,N-dimethylethanolamine, polyamines such as ethylenediamine, diethylenetriamine, tetraethylenepentaamine, tris(hydroxymethyl)aminomethane, m-xylylenediamine, p-xylylenediamine and 1,3-bis(aminomethyl)cyclohexane, aminosulfonic acids such as taurine, aminothiols such as 2-aminoethanethiol and nitrogen-containing heterocyclic compounds such as 3-picolylamine and 3-pyridinemethanol. The compound 2-aminoethanol is especially preferred from the viewpoint of the plating growth rate.

The degreasing solution may be a commercial product, and specifically ALC-009 (containing 2-aminoethanol as the compound with an amino group) by Uyemura & Co., Ltd., and Cleaner Securigant 902 (containing 2-aminoethanol as the compound with an amino group) by Atotech Japan may be mentioned.

The concentration of the compound with an amino group in the degreasing solution is preferably 5 mmol/L or greater, more preferably 10 mmol/L or greater and even more preferably 20 mmol/L or greater, from the viewpoint of removing substances that inhibit plating reaction. From the viewpoint of promoting the plating reaction, it is preferably 100 mmol/L or lower, more preferably 90 mmol/L or lower and even more preferably 80 mmol/L.

The immersion time for the conductive substrate in the degreasing solution is preferably 1 minute or longer and more preferably 2 minutes or longer, from the viewpoint of contributing to the growth rate of the plating. From the viewpoint of reducing damage to the substrate it is also preferably within 15 minutes and more preferably within 10 minutes. Immersion while stirring is preferred from the viewpoint of uniform degreasing.

The immersion temperature is preferably 15° C. or higher, more preferably 30° C. or higher and even more preferably 40° C. or higher in order to increase the effect of promoting the plating growth rate. From the viewpoint of reducing damage to the substrate it is also preferably 70° C. or lower and more preferably 60° C. or lower.

After the degreasing step, the conductive substrate is preferably washed and then plated. Water is the preferred washing solution. The washing solution temperature is preferably 15° C. or higher and more preferably 20° C. or higher. From the viewpoint of reducing damage to the substrate it is also preferably 70° C. or lower and more preferably 60° C. or lower.

<Plating Step>

In this step, a degreased or non-degreased copper-containing film is plated. If the copper-containing film (reduced copper layer) of the conductive substrate obtained as described above is subjected to electrolytic plating or electroless plating, it is possible to form a plating layer (such as a plated copper layer) of the desired thickness and to obtain a conductive pattern composed of the reduced copper layer and plating layer. This allows production of a structure with an electroconductive pattern.

Electroless plating is more preferred from the viewpoint of wider applicability to patterns. Electroless plating is especially preferred for wirings with patterns formed by lasers.

Common electroplating may be employed for the electrolytic plating. For example, an electrode is placed at one end in a solution containing copper ion (plating bath), and the conductive substrate to be plated is placed at the other end. A direct current is then applied between the electrode and conductive substrate from an external DC power supply. A tool (such as a clip) connected to one electrode of the external DC power supply may be connected to the reduced copper layer on the conductive substrate to allow application of a current to the reduced copper layer. As a result, copper precipitates by reduction of copper ion on the surface of the reduced copper layer on the conductive substrate, forming a plated copper layer.

The electrolytic plating solution used may be a copper sulfate bath, a copper borofluoride bath, a copper cyanide bath or a pyrophosphate bath. From the viewpoint of safety and productivity it is preferred to use a copper sulfate bath or a pyrophosphate bath.

Examples of copper sulfate plating baths include copper sulfate pentahydrate, sulfuric acid-acidic copper sulfate plating baths containing sulfuric acid and chlorine. The concentration of copper sulfate pentahydrate in a copper sulfate plating bath is preferably 50 g/L to 300 g/L and more preferably 100 g/L to 200 g/L. The sulfuric acid concentration is preferably 40 g/L to 160 g/L and more preferably 80 g/L to 120 g/L. The plating bath solvent will usually be water. The plating bath temperature is preferably 20 to 60° C. and more preferably 30 to 50° C. The current density during electrolysis is preferably 1 to 15 A/dm$^2$ and more preferably 2 to 10 A/dm$^2$.

Examples of suitable copper pyrophosphate plating baths include plating baths containing copper pyrophosphate and potassium pyrophosphate. The concentration of copper pyrophosphate in a copper pyrophosphate plating bath is preferably 60 g/L to 110 g/L and more preferably 70 g/L to 90 g/L. The potassium pyrophosphate concentration is preferably 240 g/L to 470 g/L and more preferably 300 g/L to 400 g/L. The plating bath solvent will usually be water. The pH of the plating bath is preferably 8.0 to 9.0 and more preferably 8.2 to 8.8. Ammonia water or the like may also be added for pH adjustment. The plating bath temperature is preferably 20 to 60° C. and more preferably 30 to 50° C. The current density during electrolysis is preferably 0.5 to 10 A/dm$^2$ and more preferably 1 to 7 A/dm$^2$.

The plating bath for electrolytic plating may further comprise a surfactant.

A common electroless plating method may be employed for electroless plating. Electroless plating is carried out during the degreasing step or the washing step, for example. Examples for the electroless plating include plating solutions containing copper ion and a reducing agent. By immersing the conductive substrate in the plating solution while bubbling in air, the copper ion in the plating solution is reduced and copper precipitates on the surface of the reduced copper layer, forming a plated copper layer.

The electroless plating used may be, for example, a plating solution containing $CuSO_4$ as the copper ion source, EDTA (ethylenediaminetetraacetic acid) or a Rochelle salt as the complexing agent, and formaldehyde ($CH_2O$), potassium tetrahydroate, dimethylamineborane, glyoxylic acid or phosphinic acid as the reducing agent. Commercial products that may be used include THRUCUP PEA-6 and THRUCUP ELC-SP by Uyemura & Co., Ltd., MELPLATE CU-390 and MELPLATE CU-5100P by Meltex, Inc., OPC CUPPER HFS, OPC CUPPER NCA and ATS ADCUPPER IW by Okuno Chemical Industries Co., Ltd., CUPOSIT328 and C4500 by Rohm & Haas, AtotechMVTP1 and Printganth UPlus by Atotech Co., Ltd. and Cu-150 and Cu-510 by MacDermid Performance Solutions Japan K.K. A plating solution is used for electroless plating. The plating solution preferably comprises EDTA (ethylenediaminetetraacetic acid). It is thought that EDTA functions as a complexing agent to form a highly stable complex with copper ion, thus inhibiting secondary reactions in the plating bath and stabilizing the bath, and also promoting uniform plating deposition to help prevent detachment of the coated film. The use of an EDTA-containing plating solution therefore contributes to production of a structure with an electroconductive pattern with excellent interlayer adhesiveness. EDTA also is stable in high-temperature solutions and therefore helps to increase the plating rate when an EDTA-containing plating solution is used at high temperature (such as 30° C. or higher). From the viewpoint of satisfactorily obtaining the advantages of EDTA, the amount of EDTA in the plating solution is preferably 7 g/L or greater, 10 g/L or greater or 15 g/L or greater, and from the viewpoint of reducing impurities in the precipitated plating it is preferably 50 g/L or lower, 45 g/L or lower or 40 g/L or lower.

The temperature of the electroless plating bath is preferably 25 to 80° C., or if rapid plating growth is desired it is preferably 30° C. to 70° C. and more preferably 35° C. to 65° C. The plating time is preferably 5 to 60 minutes, more preferably 5 to 50 minutes and more preferably 10 to 40 minutes.

The plating bath for electroless plating may further comprise a surfactant.

Electroless plating is preferably carried out using a plating solution with a copper concentration in the range of 1.5 g/L to 5.0 g/L. A concentration of 1.5 g/L or greater is preferred to increase the plating speed, while a concentration of 5.0 g/L or lower is preferred from the viewpoint of homogeneity of the plated coating film. The copper concentration is more preferably1.5 g/L to 4.0 g/L, even more preferably 1.8 g/L to 3.5 g/L and yet more preferably 2.0 g/L to 3.0 g/L.

After the plating step, the conductive substrate is preferably washed and then plated. Water is the preferred washing solution. The washing solution temperature is preferably 15° C. or higher and more preferably 20° C. or higher. From the viewpoint of reducing damage to the substrate it is also preferably 70° C. or lower and more preferably 60° C. or lower.

The thickness of the plating layer (plated copper layer according to one aspect) is preferably 1 µm to 100 µm, more preferably 1 µm to 50 µm and even more preferably 2 µm to 30 µm, from the viewpoint of allowing flow of the current required for the structure with an electroconductive pattern.

Plating can lower the porosity in the first main surface-side region of the laser light-exposed copper-containing film. The percentage reduction in the porosity in the first main surface-side region can be controlled by adjusting the plating solution composition, the plating time and the plating temperature. Lengthening the plating time, for example, will tend to lower the porosity of the copper-containing film. The percentage reduction during this time is also affected by the degreasing step described above. For example, lengthening the degreasing time in the degreasing step contributes to a lower porosity of the copper-containing film. The percentage reduction of the porosity in the first main surface-side region is the value calculated by the formula:

Percentage reduction in porosity of first main surface-side region=[(Porosity in first main surface-side region immediately after formation of copper-containing film)−(porosity in first main surface-side region after plating step)]/[porosity in first main surface-side region immediately after formation of copper-containing film].

From the viewpoint of improving the electroconductivity of the copper-containing film, for example, the percentage reduction in the porosity is preferably 1.0 vol % or greater, more preferably 1.5 vol % or greater and even more preferably 2.0 vol % or greater, and preferably 50 vol % or lower from the viewpoint of preventing detachment of the electroconductive layer by stress resulting from fewer voids.

According to one aspect, the second main surface-side region of the electroconductive layer is a plated copper layer formed by the plating step described above. The porosity in the second main surface-side region can be controlled by the plating conditions. For example, lengthening the plating time helps to reduce the porosity of the plating layer.

According to one aspect, when the third region is formed so that at least part of the third region has the same properties as the first main surface-side region, controlling the laser light exposure conditions and/or the plating conditions, for example, can alter the porosity of the copper-containing film to the desired range and control the porosities in the first main surface-side region and third region to the desired ranges. According to another aspect, when the third region is formed so that at least part of the third region has the same properties as the second main surface-side region, controlling the plating conditions can alter the porosity of the copper-containing film to the desired range while adjusting the porosity of the plating layer, to allow control of the porosities in the second main surface-side region and the third region to the desired ranges. The porosities in the first main surface-side region, second main surface-side region and third region can be controlled to the desired ranges by optimization of the conditions for the series of steps from laser light irradiation to degreasing and plating.

The thickness at the parts of the copper-containing film having the porosity of the first main surface-side region (for example, parts of the third region having the same porosity as the first main surface-side region), is preferably 0.001 to 10 µm, more preferably 0.01 to 8 µm and even more preferably 0.1 to 7 µm. The preferred thickness for the parts having the porosity of the second main surface-side region (for example, including parts of the third region that have the same porosity as the second main surface-side region, which are typically the plated copper layer) is the same as the thickness of the plated copper layer, i.e. preferably 1 µm to 100 µm, more preferably 1 µm to 50 µm and even more preferably 2 µm to 30 µm.

<Preferred Example for Method for Producing Structure with Electroconductive Pattern>

Figure 3:
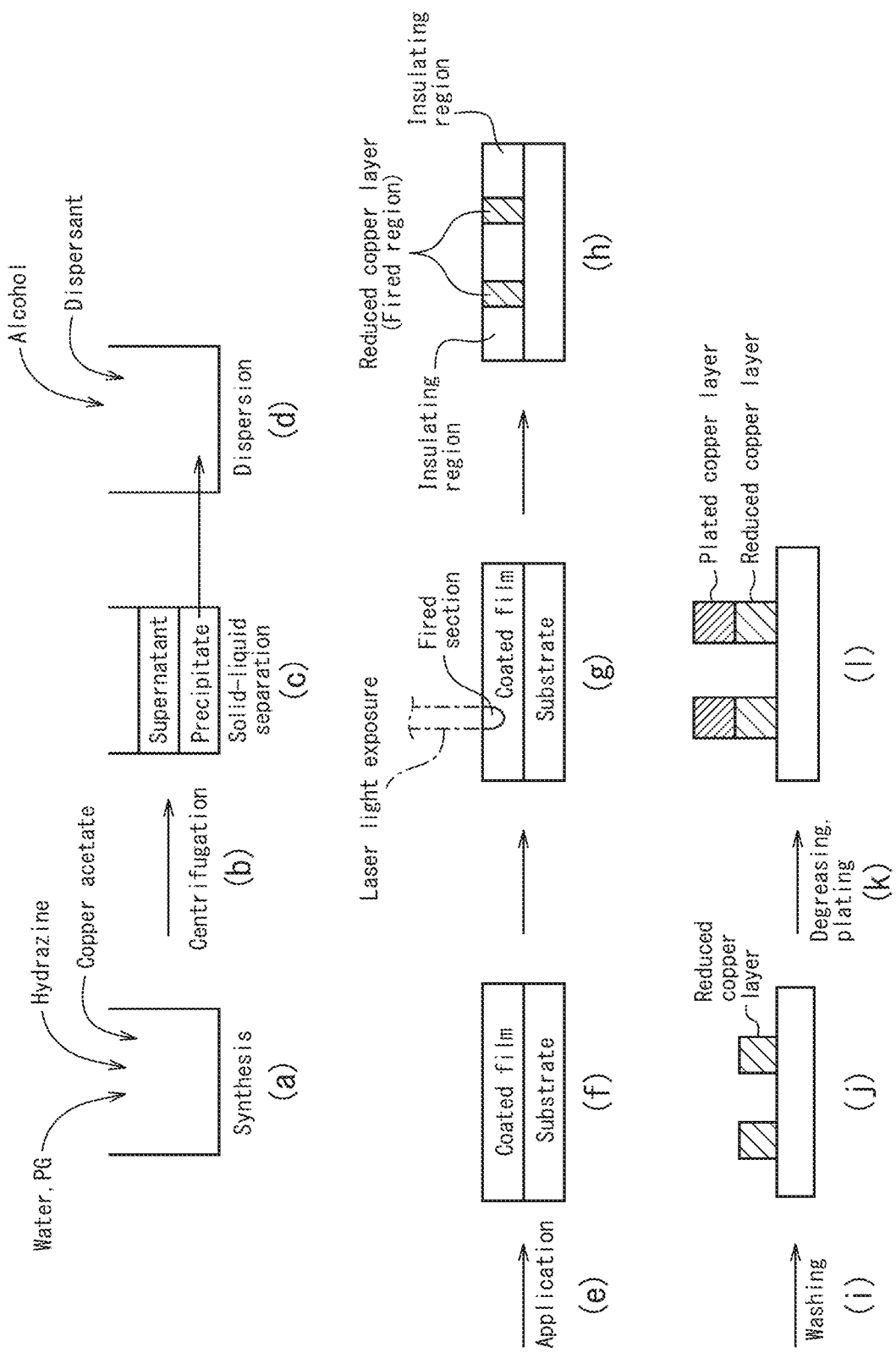
FIG. 3 is a cross-sectional schematic drawing illustrating the procedure for producing a structure with an electroconductive pattern according to one aspect of the invention.

A preferred example of a method for producing a structure with an electroconductive pattern will now be described with reference to FIG. 3.

In the coated film-forming step illustrated in FIG. 3(a), copper acetate is dissolved in a mixed solvent of water and propylene glycol (PG), hydrazine is added and the mixture is stirred.

The product solution (supernatant) and cuprous oxide (precipitate) are then centrifuged as shown in FIGS. 3(b) and (c).

Next, as shown in FIG. 3(d), a dispersant and alcohol are added to the precipitate and the precipitate is dispersed in them.

As shown in FIGS. 3(e) and (f), the copper oxide-containing dispersion is then applied onto a substrate by spray coating to form a coated film comprising copper oxide and the dispersant.

Next, as shown in FIG. 3(g), the coated film is selectively exposed to laser light to selectively fire portions of the coated film and reduce the copper oxide to copper. As shown in FIG. 3(h), this results in a conductive substrate having a single layer formed with insulating regions that include the copper oxide and dispersant, and the reduced copper layer that includes copper, disposed adjacent to each other on the substrate.

After laser light exposure, the insulating regions that include the copper oxide and dispersant are removed using an appropriate developing solution, as shown in FIG. 3(i). This step is referred to as the "developing step". This allows only the fired regions (i.e. the reduced copper layer) to be left on the substrate. Washing results in a conductive substrate having only the reduced copper layer remaining on the substrate, as shown in FIG. 3(j). According to one aspect, the developing solution comprises the dispersant with an organic solvent or water, or a mixture thereof. According to another aspect, the organic solvent is one or more selected from the group consisting of alcohols, ketones, esters and ethers. With the dispersant, the developing solution of the present disclosure can satisfactorily disperse a coating film component for a dry coating film (particularly copper oxide particles, as a development component that is difficult to remove), thus allowing satisfactory development even with a solvent system that is unlikely to damage metal wiring or substrates, such as organic solvents selected from the group consisting of alcohols, ketones, esters and ethers, and/or water. The developing solution of this disclosure contributes both to avoidance of metal wiring damage and to satisfactory developability. The solvent may be a combination of one or more solvents, and preferably it includes a polar solvent or more preferably it consists of a polar solvent. A polar solvent is especially advantageous from the viewpoint of developability since it has excellent ability to disperse copper oxide particles. The solvent in the developing solution (which may be one or a combination of two or more) preferably comprises at least one compound of the same type as the dispersing medium in the dispersion (which may also be one or a combination of two or more), or is composed of the same type of compound as the dispersing medium.

Examples of alcohols include methanol, ethanol, propanol, butanol, isopropyl alcohol, n-propyl alcohol, tertiary butanol, butanediol, ethylene glycol and glycerin.

Examples of ketones include acetone, methyl ethyl ketone, methyl isobutyl ketone, diisobutyl ketone and cyclohexanone.

Esters include methyl acetate, ethyl acetate, butyl acetate, isobutyl acetate, methoxybutyl acetate, amyl acetate, n-propyl acetate, isopropyl acetate, methyl lactate, ethyl lactate and butyl lactate.

Ethers include diethyl ether, diisopropyl ether, ethyleneglycol monomethyl ether, ethyleneglycol monoethyl ether, ethyleneglycol monobutyl ether, 1,4-diethylene oxide, vinylethylene carbonate and tetrahydrofuran.

For high polarity, the solvent in the developing solution is preferably at least one selected from the group consisting of water, ethanol, propanol, butanol and isopropyl alcohol, and most preferably it is composed of one or more of these.

According to one aspect, the developing solution comprises a dispersant. The dispersant can efficiently disperse (i.e. efficiently remove) the substrate-adhering copper oxide particles in the developing solution. The dispersant is preferably one of those mentioned above as dispersants to be included in the dispersion of the disclosure. When a phosphorus-containing organic compound is used, for example, the copper oxide particles satisfactorily disperse in the developing solution, thus facilitating development. According to one aspect, therefore, preferred examples as compounds for the dispersant in the developing solution are the same as those mentioned for dispersants above.

The dispersant content in the developing solution is preferably 0.1 mass % or greater, 0.5 mass % or greater or 1.0 mass % or greater from the viewpoint of efficiently dispersing (i.e. efficiently removing) the substrate-adhering copper oxide particles in the developing solution, and preferably 20 mass % or lower, 15 mass % or lower or 10 mass % or lower from the viewpoint of inhibiting dissolution of the metal wiring by the dispersant, from the viewpoint of allowing formation of a developing solution with low viscosity suitable for development even when using a high-viscosity dispersant, and from the viewpoint of preventing adhesion of excess dispersant onto the substrate and metal wiring and facilitating the rinsing step after development.

As shown in FIG. 3(k), the conductive substrate is then immersed in a degreasing solution containing a compound with an amino group, and the degreasing step is carried out.

A plated copper layer is then formed on the reduced copper layer as shown in FIG. 3(l).

This series of procedures allows production of a structure with an electroconductive pattern.

EXAMPLES

The invention will now be explained in detail by Examples and Comparative Examples, with the understanding that these Examples are not limitative on the invention.

<Evaluation Methods>

[Hydrazine Quantitation]

The hydrazine was quantified by the standard addition method.

To 50 µL of sample (dispersion) there were added 33 µg of hydrazine, 33 µg of surrogate substance (hydrazine$^{15}N_2H_4$) and 1 ml of a 1 mass % acetonitrile solution of benzaldehyde. GC/MS was conducted 4 hours after final addition of 20 µL of phosphoric acid.

Similarly, to 50 µL of sample (dispersion) there were added 66 µg of hydrazine, 33 µg of surrogate substance (hydrazine$^{15}N_2H_4$) and 1 ml of a 1 mass % acetonitrile solution of benzaldehyde. GC/MS was conducted 4 hours after final addition of 20 µL of phosphoric acid.

Similarly, to 50 µL of sample (dispersion) there were added 133 µg of hydrazine, 33 µg of surrogate substance (hydrazine$^{15}N_2H_4$) and 1 ml of a 1 mass % acetonitrile solution of benzaldehyde. GC/MS was conducted 4 hours after final addition of 20 μL of phosphoric acid.

Finally, to 50 μL of sample (dispersion) there were added 33 μg of surrogate substance ((hydrazine$^{15}N_2H_4$) and 1 ml of a 1 mass % acetonitrile solution of benzaldehyde but without addition of hydrazine, and GC/MS was conducted 4 hours after final addition of 20 μL of phosphoric acid.

GC/MS measurement at 4 points yielded a peak area value for hydrazine in a chromatogram with m/z=207. The peak area value for the surrogate was then obtained by mass chromatogram with m/z=209. A calibration curve was obtained by the standard addition method, plotting added hydrazine mass/added surrogate mass on the x-axis and hydrazine peak area value/surrogate substance peak area value on the y-axis.

The value of a Y slice obtained from the calibration curve was divided by the added hydrazine mass/added surrogate substance mass to obtain the hydrazine mass.

[Measurement of Mean Particle Size]

The mean particle sizes of the dispersions were measured by the cumulant method, using an FPAR-1000 by Otsuka Electronics Co., Ltd.

[Porosity Measurement and Elemental Analysis of Electroconductive Layer]

(Delimiting of First Main Surface and Second Main Surface)

After consolidating the electroconductive layer in an epoxy resin, it was processed by FIB (focused ion beam) to allow cross-sectional analysis with an SEM (scanning electron microscope), and was provided for SEM cross-sectional observation. The observation was made at 50,000× magnification. The electroconductive layer portions of the sample were processed with the image processing software ImageJ in an arbitrarily selected measuring range of 2 μm length on both the first main surface and second main surface, adjusting the contrast after smoothing and converting to 8-bit, with smoothing set to "Smooth" and with MedianFilter (Radius: 3 pixels). Binarization was then performed using the specified threshold. The threshold for binarization was determined by "Isodata", the evaluation method built into the software. The profile was then digitized using "Analyze line graph", a roughness curve was extracted, and the maximum height, minimum height, mean line and arithmetic mean roughness Ra were calculated. Since the arithmetic mean roughnesses for each of the Examples and Comparative Examples were less than 1.0 μm, the first main surface of the electroconductive layer cross-section was delimited as a line running through the point at the maximum height and extending parallel to the mean line, while the second main surface of the electroconductive layer cross-section was delimited as a line running through the point at the maximum height and extending parallel to the mean line. Porosity measurement and elemental analysis were carried out based on the delimited first main surface and second main surface on the electroconductive layer cross-section.

(Measurement of Porosity and Element Ratio)

In a rectangular observation region of 2 μm×100 nm (observation magnification of 50,000×), in a range from the first main surface to a depth of 100 nm in the thickness direction of the electroconductive layer and in a range to a depth of 100 nm from the second main surface in the thickness direction of the electroconductive layer, and after 8-bit conversion of an image obtained using an SEM with ImageJ software by the NIH (U.S. National Institutes of Health), it was processed by smoothing ("Smooth") and MedianFilter (Radius: 4 pixels). Binarization was then performed using the specified threshold. The threshold for binarization was determined by the "Triangle method", as the evaluation method built into the software. The void area was calculated using "Analyze Particles". The long diameters of the voids were measured as the maximum distance between two arbitrary points along the peripheral edge of each independent black portion in the processed image.

The element ratio was measured by EDX analysis in the same observation region.

(SEM Observation Conditions)

Apparatus: S4700 (Hitachi High-Technologies Corp.)

Secondary electron (SE) observation: 1 kV acceleration voltage

EDX analysis: 5 kV acceleration voltage

[Thickness Measurement]

The thickness was calculated from the SEM cross-sectional image.

[Resistance Value]

A resistance meter (AD7461A by Advantest Co.) was used for measurement by the 4-point measurement method.

[Adhesiveness Evaluation (Tape Peel Test)]

For the structure with an electroconductive pattern, the adhesiveness was evaluated by 90° detachment using light packaging OPP tape 618 by 3M Co. Complete detachment was evaluated as 1 point, >50% and <100% detachment of the conductive pattern area was evaluated as 2 points, and 0% to 50% detachment was evaluated as 3 points.

[Stress Relaxation]

The structure with an electroconductive pattern was evaluated for stress relaxation by bending at 90°. Complete detachment was evaluated as 1 point, >50% and <100% detachment of the conductive pattern area was evaluated as 2 points, and 0% to 50% detachment was evaluated as 3 points.

[Chemical Resistance]

The structure with an electroconductive pattern was immersed in 0.1 M hydrochloric acid and then washed. The resistance value was measured before and after treatment, and <110% as the resistance value after treatment with respect to before treatment was evaluated as 3 points, ≥110% and <150% was evaluated as 2 points, and ≥150% was evaluated as 1 point. The resistance was measured using the 4-terminal method.

[Oxidation Stability]

The structure with an electroconductive pattern was heated in air at 80° C. for 5 hours. The resistance value was measured before and after treatment, and <110% as the resistance value after treatment with respect to before treatment was evaluated as 3 points, ≥110% and <150% was evaluated as 2 points, and ≥150% was evaluated as 1 point. The resistance was measured using the 4-terminal method.

Example 1

After dissolving 806 g of copper(II) acetate monohydrate (product of Kanto Kagaku Co., Ltd.) in a mixed solvent comprising 7560 g of distilled water (product of Kyoei Pharmaceutical Co., Ltd.) and 3494 g of 1,2-propylene glycol (product of Kanto Kagaku Co., Ltd.), the solution was brought to a liquid temperature of −5° C. using an external temperature regulator. After then adding 235 g of hydrazine monohydrate (product of Tokyo Kasei Kogyo Co., Ltd.) over a period of 20 minutes, the mixture was stirred for 30 minutes in a nitrogen atmosphere, the liquid temperature was adjusted to 25° C. with an external temperature regulator, and the mixture was further stirred for 90 minutes in a nitrogen atmosphere. After stirring, centrifugal separation was carried out for separation into a supernatant and precipitate. To 390 g of the obtained precipitate there were added 13.7 g of DISPERBYK-145 (by BYK-Chemie GmbH, phosphoric acid group-containing organic compound) (4 g dispersant content) and 907 g of ethanol (by Kanto Kagaku Co., Ltd.), and a homogenizer was used for dispersion in a nitrogen atmosphere to obtain 1365 g of a dispersion containing cuprous oxide.

The dispersion was satisfactorily dispersed and had a mean particle size of 21 nm. The hydrazine content was 3000 ppm by mass.

The obtained dispersion was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 1. The coated film thickness of sample 1 was 1000 nm.

A galvano scanner was used for irradiation of the coated film of sample 1 with laser light (pulse wave oscillation, 532 nm) while moving the focal point at a maximum speed of 1200 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 11.7 vol % in the first main surface-side region. The resistance value of the conductive pattern region was 30 µΩcm.

Next, sample 1 on which the conductive pattern region had been formed was immersed in ultrapure water and shaken for one minute, after which it was dipped in ethanol and shaken for one minute to wash off the unfired regions, and dried at room temperature.

Sample 1 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 1 was dipped in for 5 minutes. After treatment, sample 1 was removed and washed. The electroless plating treatment solution was used for 30 minutes of treatment at 33° C. with THRUCUP PEA-6 ver.3 by Uyemura & Co., Ltd. The thickness of the formed plated copper layer was about 1 µm. This procedure was used to produce a structure with an electroconductive pattern for Example 1.

The resistance value of the electroconductive layer as the layered section of the conductive pattern region and plated copper layer was measured using 4-point measurement and found to be 7.3 µΩcm. This demonstrated sufficiently low resistance for electrical circuit formation.

When a cross-section of the electroconductive layer was observed by SEM, the porosity was 1.0 vol % in the first main surface-side region and 0.06 vol % in the second main surface-side region, and the elemental composition was Cu/O=100/12 in the first main surface-side region and Cu/O=100/6 in the second main surface-side region (based on atomic number).

A tape peel test (90° peeling) of the structure with an electroconductive pattern showed no peeling.

Example 2

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 2. The coated film thickness of sample 2 was 1000 nm.

A galvano scanner was used for irradiation of the coated film of sample 2 with laser light (pulse wave oscillation, 532 nm) while moving the focal point at a maximum speed of 4500 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 40 vol % in the first main surface-side region. The resistance value of the conductive pattern region was 50 µΩcm.

Next, sample 2 on which the conductive pattern region had been formed was immersed in ultrapure water and shaken for one minute, after which it was dipped in ethanol and shaken for one minute to wash off the unfired regions, and dried at room temperature.

Sample 2 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 2 was dipped in for 5 minutes. After treatment, sample 2 was removed and washed. The electroless plating treatment solution was used for 30 minutes of treatment at 33° C. with THRUCUP PEA-6 ver.3 by Uyemura & Co., Ltd. The thickness of the formed plated copper layer was about 1 µm. This procedure was used to produce a structure with an electroconductive pattern for Example 2.

When a cross-section of the electroconductive layer was observed by SEM, the porosity was 1.6 vol % in the first main surface-side region and 0.6 vol % in the second main surface-side region, and the elemental composition was Cu/O=100/14 in the first main surface-side region and Cu/O=100/9 in the second main surface-side region (based on atomic number).

Example 3

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 3. The coated film thickness of sample 3 was 1000 nm.

A galvano scanner was used for irradiation of the coated film of sample 3 with laser light (pulse wave oscillation, 532 nm) while moving the focal point at a maximum speed of 1200 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 11.7 vol % in the first main surface-side region. The resistance value of the conductive pattern region was 30 µΩcm.

Next, sample 3 on which the conductive pattern region had been formed was immersed in ultrapure water and shaken for one minute, after which it was dipped in ethanol and shaken for one minute to wash off the unfired regions, and dried at room temperature.

Sample 3 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 3 was dipped in for 5 minutes. After treatment, sample 3 was removed and washed. The electroless plating treatment solution was used for 10 minutes of treatment at 50° C. with THRUCUP PEA-6 ver.3 by Uyemura & Co., Ltd. The thickness of the formed plated copper layer was about 0.5 µm. This procedure was used to produce a structure with an electroconductive pattern for Example 3.

When a cross-section of the electroconductive layer was observed by SEM, the porosity was 5.4 vol % in the first main surface-side region and 0.9 vol % in the second main surface-side region, and the elemental composition was Cu/O=100/34 in the first main surface-side region and Cu/O=100/9 in the second main surface-side region (based on atomic number).

Example 4

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 4. The coated film thickness of sample 4 was 1000 nm.

A galvano scanner was used for irradiation of the coated film of sample 4 with laser light (pulse wave oscillation, 532 nm) while moving the focal point at a maximum speed of 3000 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 35 vol % in the first main surface-side region. The resistance value of the conductive pattern region was 45 µΩcm.

Next, sample 4 on which the conductive pattern region had been formed was immersed in ultrapure water and shaken for one minute, after which it was dipped in ethanol and shaken for one minute to wash off the unfired regions, and dried at room temperature.

Sample 4 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 4 was dipped in for 5 minutes. After treatment, sample 4 was removed and washed. The electroless plating treatment solution was used for 10 minutes of treatment at 60° C. with THRUCUP PEA-6 ver.3 by Uyemura & Co., Ltd. The thickness of the formed plated copper layer was about 0.5 µm. This procedure was used to produce a structure with an electroconductive pattern for Example 4.

When a cross-section of the electroconductive layer was observed by SEM, the porosity was 23.4 vol % in the first main surface-side region and 0.9 vol % in the second main surface-side region, and the elemental composition was Cu/O=100/11 in the first main surface-side region and Cu/O=100/10 in the second main surface-side region (based on atomic number).

Example 5

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 5. The coated film thickness of sample 5 was 1000 nm.

A galvano scanner was used for irradiation of the coated film of sample 5 with laser light (pulse wave oscillation, 532 nm) while moving the focal point at a maximum speed of 4500 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 40 vol % in the first main surface-side region. The resistance value of the conductive pattern region was 50 µΩcm.

Next, sample 5 on which the conductive pattern region had been formed was immersed in ultrapure water and shaken for one minute, after which it was dipped in ethanol and shaken for one minute to wash off the unfired regions, and dried at room temperature.

Sample 5 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 5 was dipped in for 5 minutes. After treatment, sample 5 was removed and washed. The electroless plating treatment solution was used for 10 minutes of treatment at 65° C. with THRUCUP PEA-6 ver.3 by Uyemura & Co., Ltd. The thickness of the formed plated copper layer was about 0.5 µm. This procedure was used to produce a structure with an electroconductive pattern for Example 5.

When a cross-section of the electroconductive layer was observed by SEM, the porosity was 27.2 vol % in the first main surface-side region and 0.9 vol % in the second main surface-side region, and the elemental composition was Cu/O=100/10 in the first main surface-side region and Cu/O=100/9 in the second main surface-side region (based on atomic number).

Example 6

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 6. The coated film thickness of sample 6 was 1000 nm.

A galvano scanner was used for irradiation of the coated film of sample 6 with laser light (pulse wave oscillation, 532 nm) while moving the focal point at a maximum speed of 6000 m/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.6 µm and the porosity was 45 vol % in the first main surface-side region. The resistance value of the conductive pattern region was 53 µΩcm.

Next, sample 6 on which the conductive pattern region had been formed was immersed in ultrapure water and shaken for one minute, after which it was dipped in ethanol and shaken for one minute to wash off the unfired regions, and dried at room temperature.

Sample 6 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 6 was dipped in for 5 minutes. After treatment, sample 6 was removed and washed. The electroless plating treatment solution was used for 10 minutes of treatment at 65° C. with THRUCUP PEA-6 ver.3 by Uyemura & Co., Ltd. The thickness of the formed plated copper layer was about 0.5 µm. This procedure was used to produce a structure with an electroconductive pattern for Example 6.

When a cross-section of the electroconductive layer was observed by SEM, the porosity was 34.3 vol % in the first main surface-side region and 3.1 vol % in the second main surface-side region, and the elemental composition was Cu/O=100/13 in the first main surface-side region and Cu/O=100/10 in the second main surface-side region (based on atomic number).

Example 7

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 7. The coated film thickness of sample 7 was 1000 nm.

A galvano scanner was used for irradiation of the coated film of sample 7 with laser light (pulse wave oscillation, 532 nm) while moving the focal point at a maximum speed of 1800 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 22 vol % in the first main surface-side region. The resistance value of the conductive pattern region was 35 µΩcm.

Next, sample 7 on which the conductive pattern region had been formed was immersed in ultrapure water and shaken for one minute, after which it was dipped in ethanol and shaken for one minute to wash off the unfired regions, and dried at room temperature.

Sample 7 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 7 was dipped in for 5 minutes. After treatment, sample 7 was removed and washed. The electroless plating treatment solution was used for 30 minutes of treatment at 33° C. with THRUCUP PEA-6 ver.3 by Uyemura & Co., Ltd. The thickness of the formed plated copper layer was about 1.0 µm.

The sample was then further subjected to electrolytic plating to form an electrolytic plated copper layer on the plated copper layer. The electrolytic plating solution used was electrolytic plating M-1 by Kiyokawa Plating Industry Co., Ltd., and treatment was with flow of 0.01 A current for 5 minutes. The thickness of the layered copper was about 1.0 µm. This procedure was used to produce a structure with an electroconductive pattern for Example 7.

When a cross-section of the electroconductive layer was observed by SEM, the porosity was 6.4 vol % in the first main surface-side region and 9.8 vol % in the second main surface-side region, and the elemental composition was Cu/O=100/10 in the first main surface-side region and Cu/O=100/18 in the second main surface-side region (based on atomic number).

Example 8

Copper paste with a mean particle size of 5 µm was applied onto a polyimide film (KAPTONE 500H by Toray-DuPont Co., Ltd., 125 µm thickness) by bar coating and kept for 2 hours in an oven at 90° C. to volatilize off the solvent in the coated film and obtain sample 8. The coated film thickness of sample 8 was 1000 nm.

A galvano scanner was used for irradiation of the coated film of sample 8 with laser light (pulse wave oscillation, 532 nm) while moving the focal point at a maximum speed of 1200 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.8 µm and the porosity was 53.2 vol % in the first main surface-side region. The resistance value of the conductive pattern region was 122 µΩcm.

Sample 8 on which the conductive pattern region had been formed was then subjected to electroless plating to form a layer of copper (plated copper layer) on the conductive pattern region. For pretreatment prior to electroless plating, a treatment solution of ACL-009 (Uyemura & Co., Ltd.) dissolved in water to 50 mL/L was heated to 50° C. and sample 8 was dipped in for 5 minutes. After treatment, sample 8 was removed and washed. The electroless plating treatment solution was used for 30 minutes of treatment at 33° C. with THRUCUP PEA-6 ver.3 by Uyemura & Co., Ltd. The thickness of the formed plated copper layer was about 1.0 µm. This procedure was used to produce a structure with an electroconductive pattern for Example 8.

When a cross-section of the electroconductive layer was observed by SEM, the porosity was 2.2 vol % in the first main surface-side region and 1.8 vol % in the second main surface-side region, and the elemental composition was Cu/O=100/7 in the first main surface-side region and Cu/O=100/7 in the second main surface-side region (based on atomic number).

Comparative Example 1

A PET substrate was set in a vacuum chamber and vacuum pumped to a back pressure of $8 \times 10^-$ Pa. Vacuum vapor deposition was carried out with the copper vapor deposition source temperature set to 1350° C. and the vapor deposition rate at 1 angstrom/sec. The vapor deposited copper film thickness was 500 nm. This procedure was used to produce a structure with an electroconductive pattern for Comparative Example 1.

SEM observation of a cross-section of the electroconductive layer indicated that the copper film was vapor deposited, and therefore the first main surface had no voids. The elemental composition was Cu/O=100/6 on the first main surface-side region and Cu/O=100/6 on the second main surface-side region (based on atomic number).

Comparative Example 2

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 10. The coated film thickness of sample 10 was 1000 nm.

A galvano scanner was used for irradiation of the coated film of sample 10 with laser light (pulse wave oscillation, 532 nm) while moving the focal point at a maximum speed of 1200 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 11.7 vol % in the first main surface-side region. The resistance value of the conductive pattern region was 30 µΩcm.

Next, sample 10 on which the conductive pattern region had been formed was immersed in ultrapure water and shaken for one minute, after which it was dipped in ethanol and shaken for one minute to wash off the unfired regions, and dried at room temperature.

The sample was then subjected to electrolytic plating to form an electrolytic plated copper layer. The electrolytic plating solution used was electrolytic plating M-1 by Kiyokawa Plating Industry Co., Ltd., and treatment was with flow of 0.1 A current for 10 minutes. The thickness of the layered copper was about 10 µm. This procedure was used to produce a structure with an electroconductive pattern for Comparative Example 2.

When a cross-section of the electroconductive layer was observed by SEM, the porosity was 11.7 vol % in the first main surface-side region and 50.9 vol % in the second main surface-side region, and the elemental composition was Cu/O=100/18 in the first main surface-side region and Cu/O=100/18 in the second main surface-side region (based on atomic number).

Comparative Example 3

A dispersion obtained in the same manner as Example 1 was applied onto a polyimide film (KAPTONE 500H by Toray-DuPont Co., Ltd., 125 µm thickness) by spin coating and kept for 2 hours in an oven at 90° C. to volatilize off the solvent in the coated film and obtain sample 11. The coated film thickness of sample 11 was 1000 nm.

A galvano scanner was used for irradiation of the coated film of sample 11 with laser light (pulse wave oscillation, 532 nm) while moving the focal point at a maximum speed of 1200 mm/min, to obtain a desired copper-containing conductive pattern region (copper-containing film) with 0.5 mm×5 mm dimensions. The coated film remained in the regions that were not exposed to the laser light.

When the copper cross-section of the conductive pattern region was observed by SEM, the thickness was found to be 0.5 µm and the porosity was 11.7 vol % in the first main surface-side region. The resistance value of the conductive pattern region was 30 µΩcm.

Next, sample 11 on which the conductive pattern region had been formed was immersed in ultrapure water and shaken for one minute, after which it was dipped in ethanol and shaken for one minute to wash off the unfired regions, and dried at room temperature.

A dispersion obtained in the same manner as Example 1 was applied onto the sample by spin coating and kept for 2 hours in an oven at 90° C. to volatilize off the solvent in the coated film. It was then fired with a plasma firing apparatus at 1.5 kW, 240 seconds, 140 Pa pressure, while streaming in a small amount of a 3% hydrogen/97% nitrogen (v/v) mixed gas. This procedure was used to produce a structure with an electroconductive pattern for Comparative Example 3.

When a cross-section of the electroconductive layer was observed by SEM, the porosity was 6.4 vol % in the first main surface-side region and 12.9 vol % in the second main surface-side region, and the elemental composition was Cu/O=100/22 in the first main surface-side region and Cu/O=100/29 in the second main surface-side region (based on atomic number).

Table 1 shows the results of evaluating the porosity, oxygen atom contents, adhesiveness (tape peel test), stress relaxation, chemical resistance and oxidation stability for the samples of the Examples and Comparative Examples. The adhesiveness, stress relaxation, chemical resistance and oxidation stability evaluations were graded on a 3-point scale, with the totals listed in the table.

[Table 1]

TABLE 1

| Evaluation | Example 1 | Example 2 | Example 3 | Example 4 | Example 5 | Example 6 |
|---|---|---|---|---|---|---|
| Porosity in first main surface-side region (%) | 1.00 | 1.60 | 5.40 | 23.40 | 27.20 | 34.30 |
| Porosity in second main surface-side region (%) | 0.06 | 0.60 | 0.90 | 0.90 | 0.90 | 3.10 |
| Porosity in first main surface-side region > porosity in second main surface-side region | Yes | Yes | Yes | Yes | Yes | Yes |
| O/Cu in first main surface-side region > O/Cu in second main surface-side region | Yes | Yes | Yes | Yes | Yes | Yes |
| O/Cu in first main surface-side region | 0.12 | 0.14 | 0.34 | 0.11 | 0.10 | 0.13 |
| Voids of ≤80 nm in first main surface-side region | Present | Present | Present | Present | Present | Present |
| Chemical resistance evaluation (points) | 3 | 3 | 2 | 2 | 2 | 2 |
| Stress relaxation evaluation (points) | 3 | 3 | 3 | 3 | 3 | 3 |
| Adhesiveness evaluation (points) | 3 | 3 | 3 | 3 | 3 | 3 |
| Oxidation stability evaluation (points) | 3 | 3 | 3 | 2 | 2 | 2 |
| Total | 12 | 12 | 11 | 10 | 10 | 10 |

| Evaluation | Example 7 | Example 8 | Comp. Example 1 | Comp. Example 2 | Comp. Example 3 |
|---|---|---|---|---|---|
| Porosity in first main surface-side region (%) | 6.40 | 2.20 | 0.00 | 11.70 | 6.40 |
| Porosity in second main surface-side region (%) | 9.80 | 1.80 | 0.00 | 50.90 | 12.90 |
| Porosity in first main surface-side region > porosity in second main surface-side region | No | Yes | No | No | No |
| O/Cu in first main surface-side region > O/Cu in | Yes | No | No | No | No |

TABLE 1-continued

| | | | | | |
|---|---|---|---|---|---|
| second main surface-side region | | | | | |
| O/Cu in first main surface-side region | 0.10 | 0.07 | 0.06 | 0.18 | 0.22 |
| Voids of ≤80 nm in first main surface-side region | Present | Present | Absent | Present | Present |
| Chemical resistance evaluation (points) | 2 | 3 | 3 | 1 | 1 |
| Stress relaxation evaluation (points) | 2 | 2 | 1 | 2 | 2 |
| Adhesiveness evaluation (points) | 3 | 1 | 1 | 1 | 3 |
| Oxidation stability evaluation (points) | 2 | 3 | 3 | 2 | 1 |
| Total | 9 | 9 | 8 | 6 | 7 |

The present invention is not limited to the embodiments and Examples described above. The present invention also encompasses the aforementioned embodiments and Examples with designs modified based on knowledge of a person skilled in the art, and any arbitrary combinations of the embodiments and Examples.

INDUSTRIAL APPLICABILITY

The present invention can be suitably applied for production of printed circuit boards, antennas, electronic devices, electromagnetic shields, antistatic films and the like.

REFERENCE SIGNS LIST

100 Strcuture with electroconductive pattern
11 Substrate
12 Electroconductive layer
13 Resin
200 Copper oxide ink
22 Copper oxide
23 Phosphoric acid ester salt
23a Phosphorus
23b Ester salt
R1 First main surface-side region
R2 Second main surface-side region
R3 Third region
R31 Site with same properties as region R1 on first main surface
R32 Site with same properties as region R2 on second main surface
R33 Other site
S1 First main surface
S2 Second main surface
S1a, S2a Side
V Void

The invention claimed is:

1. A structure with an electroconductive pattern comprising a substrate, and a copper-containing electroconductive layer disposed on the surface of the substrate,
wherein, when the main surface of the electroconductive layer on the opposite side from the substrate is defined as the first main surface and the main surface on the opposite side from the first main surface is defined as the second main surface, the electroconductive layer has a porosity of 0.01 vol % to 50 vol % in the first main surface-side region that extends from the first main surface to a depth of 100 nm in the thickness direction of the electroconductive layer, and has a porosity of 10 vol % or lower in the second main surface-side region that extends from the second main surface to a depth of 100 nm in the thickness direction of the electroconductive layer, and
wherein the element ratio of oxygen atoms to copper atoms in the first main surface-side region is greater than the element ratio of oxygen atoms to copper atoms in the second main surface-side region.

2. The structure with an electroconductive pattern according to claim 1, wherein the porosity in the first main surface-side region is greater than the porosity in the second main surface-side region.

3. The structure with an electroconductive pattern according to claim 1, wherein the element ratio of oxygen atoms to copper atoms in the first main surface-side region is greater than 0.025.

4. The structure with an electroconductive pattern according to claim 1, wherein the second main surface includes nickel and/or gold.

5. The structure with an electroconductive pattern according to claim 1, wherein part of the electroconductive layer is covered with a resin.

6. The structure with an electroconductive pattern according to claim 1, which further comprises a solder layer situated on part of the surface of the electroconductive layer.

7. The structure with an electroconductive pattern according to claim 1, wherein the electroconductive layer is an antenna.

8. The structure with an electroconductive pattern according to claim 1, wherein the electroconductive layer is printed circuit board wiring.

9. A structure with an electroconductive pattern comprising a substrate, and a copper-containing electroconductive layer disposed on the surface of the substrate,
wherein, when the main surface of the electroconductive layer on the opposite side from the substrate is defined as the first main surface and the main surface on the opposite side from the first main surface is defined as the second main surface, the electroconductive layer has a porosity of 0.01 vol % to 50 vol % in the first main surface-side region that extends from the first main surface to a depth of 100 nm in the thickness direction of the electroconductive layer, and has a porosity of 10 vol % or lower in the second main surface-side region that extends from the second main surface to a depth of 100 nm in the thickness direction of the electroconductive layer, and wherein the element ratio of oxygen atoms to copper atoms in the first main surface-side region is greater than 0.025.

10. The structure with an electroconductive pattern according to claim 9, wherein the porosity in the first main surface-side region is greater than the porosity in the second main surface-side region.

11. The structure with an electroconductive pattern according to claim 9, wherein the second main surface includes nickel and/or gold.

12. The structure with an electroconductive pattern according to claim 9, wherein part of the electroconductive layer is covered with a resin.

13. The structure with an electroconductive pattern according to claim 9, which further comprises a solder layer situated on part of the surface of the electroconductive layer.

14. The structure with an electroconductive pattern according to claim 9, wherein the electroconductive layer is an antenna.

15. The structure with an electroconductive pattern according to claim 9, wherein the electroconductive layer is printed circuit board wiring.

* * * * *